US011238917B2

(12) United States Patent
Mayer et al.

(10) Patent No.: US 11,238,917 B2
(45) Date of Patent: Feb. 1, 2022

(54) MODE-DEPENDENT HEATING OF A MEMORY DEVICE

(71) Applicant: Micron Technology, Inc., Boise, ID (US)

(72) Inventors: Peter Mayer, Neubiberg (DE); Michael Dieter Richter, Ottobrunn (DE); Martin Brox, Munich (DE); Wolfgang Anton Spirkl, Germering (DE); Thomas Hein, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/579,475

(22) Filed: Sep. 23, 2019

(65) Prior Publication Data

US 2020/0126612 A1 Apr. 23, 2020

Related U.S. Application Data

(60) Provisional application No. 62/749,454, filed on Oct. 23, 2018.

(51) Int. Cl.
*G11C 11/56* (2006.01)
*G11C 11/406* (2006.01)
(Continued)

(52) U.S. Cl.
CPC ...... *G11C 11/40626* (2013.01); *G06F 1/3275* (2013.01); *G06F 11/3058* (2013.01); *G11C 11/409* (2013.01); *G11C 11/565* (2013.01)

(58) Field of Classification Search
CPC ............ G11C 11/40626; G11C 11/409; G11C 11/565; G11C 7/1045; G11C 11/2293;
(Continued)

(56) References Cited

U.S. PATENT DOCUMENTS

| 6,778,453 | B2 | 8/2004 | Cooper et al. |
| 7,084,695 | B2 * | 8/2006 | Porter ................... G01K 7/015 327/512 |

(Continued)

OTHER PUBLICATIONS

ISA/KR, International Search Report and Written Opinion of the International Searching Authority, Int'l. Appl. No. PCT/US2019/054759, dated Jan. 23, 2020, Korean Intellectual Property Office, Seo-gu, Daejeon, Republic of Korea, 13 pgs.

*Primary Examiner* — Khamdan N. Alrobaie
(74) *Attorney, Agent, or Firm* — Holland & Hart LLP

(57) ABSTRACT

Methods, systems, and devices for controlled and mode-dependent heating of a memory device are described. In various examples, a memory device or an apparatus that includes a memory device may have circuitry configured to heat the memory device. The circuitry configured to heat the memory device may be activated, deactivated, or otherwise operated based on an indication of a temperature (e.g., of the memory device). In some examples, activating or otherwise operating the circuitry configured to heat the memory device may be based on an operating mode (e.g., of the memory device), which may be associated with certain access operations or operational states (e.g., of the memory device). Various operations or operating modes (e.g., of the memory device) may also be based on indications of a temperature (e.g., of the memory device).

25 Claims, 12 Drawing Sheets

(51) Int. Cl.
*G11C 11/409* (2006.01)
*G06F 1/3234* (2019.01)
*G06F 11/30* (2006.01)

(58) Field of Classification Search
CPC ............ G11C 11/2273; G11C 11/2275; G11C 11/221; G11C 7/04; G06F 1/3275; G06F 11/3058; G06F 1/206; Y02D 10/00
See application file for complete search history.

(56) References Cited

U.S. PATENT DOCUMENTS

| | | | |
|---|---|---|---|
| 2001/0014049 A1 | 8/2001 | Woo et al. | |
| 2002/0066047 A1 | 5/2002 | Olarig et al. | |
| 2007/0030020 A1* | 2/2007 | Kinsley | G01R 31/2856 324/750.03 |
| 2009/0003109 A1* | 1/2009 | Thorp | G11C 7/04 365/211 |
| 2015/0301744 A1* | 10/2015 | Kim | G06F 3/0616 711/103 |
| 2016/0104531 A1* | 4/2016 | Brooks | G11C 13/0069 365/148 |
| 2018/0075927 A1 | 3/2018 | Jeong et al. | |
| 2018/0101204 A1 | 4/2018 | Fackenthal | |

\* cited by examiner

MODE-DEPENDENT HEATING OF A MEMORY DEVICE

CROSS REFERENCE

The present Application for Patent claims priority to U.S. Provisional Patent Application No. 62/749,454 by Mayer et al., entitled "MODE-DEPENDENT HEATING OF A MEMORY DEVICE," filed Oct. 23, 2018, which is assigned to the assignee hereof and is expressly incorporated by reference in its entirety.

BACKGROUND

The following relates generally to a system that includes at least one memory device and more specifically to controlled and mode-dependent heating of a memory device.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including those that employ magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, such as PCM and FeRAM, may maintain stored logic states for extended periods of time even in the absence of an external power source. Volatile memory devices, such as DRAM, may lose stored logic states over time unless they are periodically refreshed by a power source. In some cases, non-volatile memory may use similar device architectures as volatile memory but may have non-volatile properties by employing such physical phenomena as ferroelectric capacitance or different material phases.

In some applications, a memory device may be included as part of, or be otherwise associated with (e.g., coupled with, controlled by) a host device. The host device may be configured for operation in an environment associated with an ambient temperature range, and at least some operations of the memory device may be temperature-sensitive.

DETAILED DESCRIPTION

Figure 1:
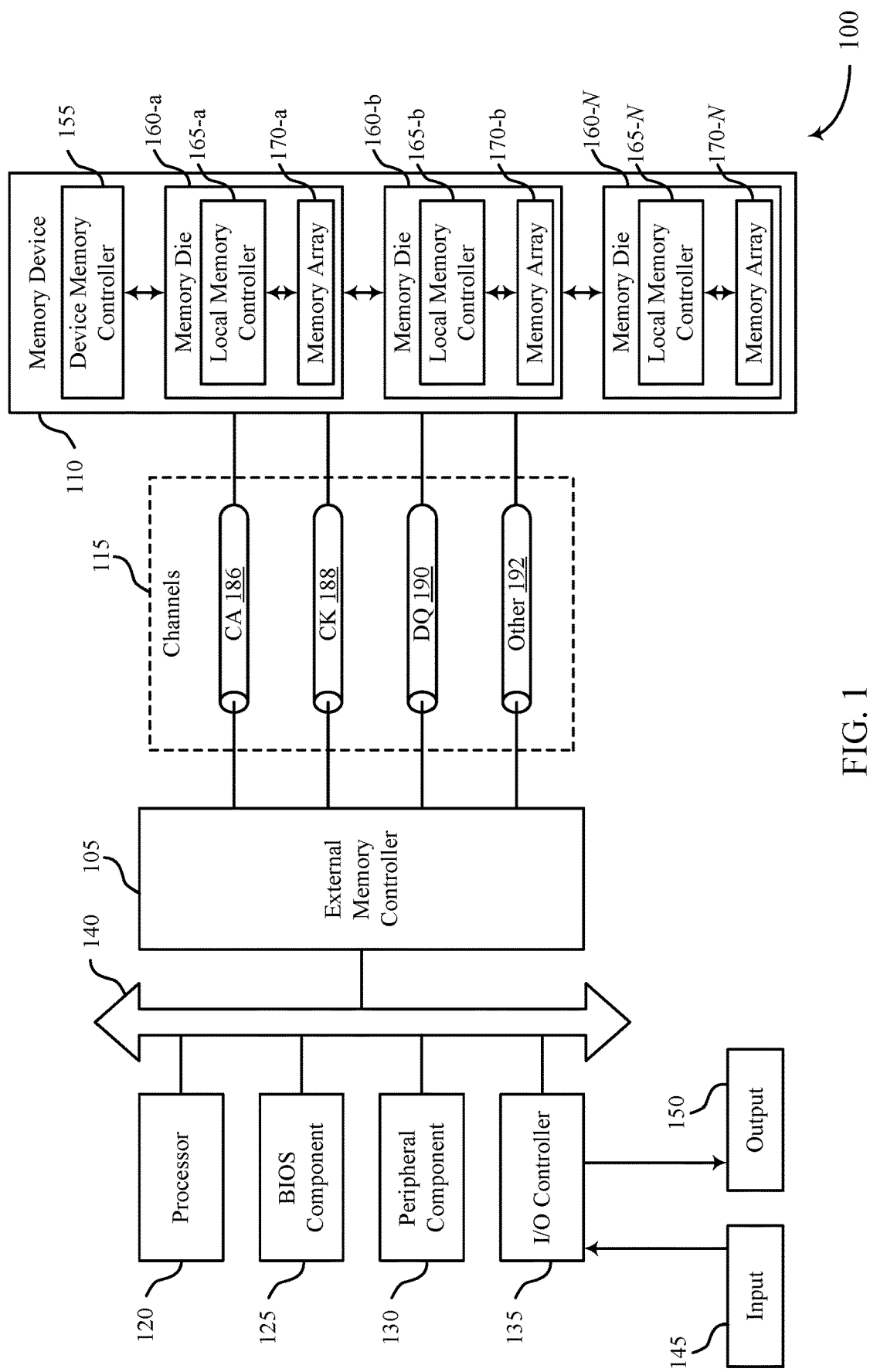
FIG. 1 illustrates an example of a system that supports controlled and mode-dependent heating of a memory device, in accordance with aspects disclosed herein.

A system or host device that includes a memory device may be designed or configured to operate in a range of ambient temperatures that is different than a range of operating temperatures designed or configured for the memory device. For example, automotive systems (e.g., vehicles, vehicle components, vehicle processors or controllers), networking systems (e.g., wireless base stations), or mobile devices may be designed to operate in relatively low ambient temperatures (e.g., an ambient temperature as low as −40° C., an ambient temperature range of −40° C. to 105° C. or 115° C.), which may be lower than a designed operating temperature (e.g., supported, having one or more guaranteed or otherwise specified performance characteristics) of a memory device (e.g., as low as 0° C.).

One or more aspects of memory device operation may be temperature-dependent, and it may be desirable to ensure the memory device satisfies operational parameters across the ambient temperature range expected for a system or host device. In various examples of the described techniques, a memory device or an apparatus or system that includes a memory device may include circuitry or other components configured to heat the memory device. The circuitry or other components configured to heat the memory device may be activated, deactivated, or otherwise operated based on an indication of a temperature of the memory device (e.g., an indication of a bulk temperature of the memory device, an indication of an average temperature of the memory device, an indication of an aggregate temperature of the memory device), which in some examples may reduce an operating temperature range of the memory device to be narrower than an ambient temperature range of a system or a host device that includes the memory device.

Controlled memory heating in accordance with the described techniques may beneficially enable a memory device to satisfy a relatively wider ambient temperature range parameter of a system or host device while operating the memory device within a relatively narrower operating temperature range. A relatively narrower operating temperature range may further support improved optimization of operating parameters (e.g., voltage or timing parameters) for the memory device.

In some examples, activating, deactivating, or otherwise operating the circuitry or other components configured to heat the memory device may be based on a target (desired) operating mode of the memory device, which may be associated with certain access operations or operational states of the memory device. For example, relatively lower temperatures may be beneficial for certain operations or operational modes (e.g., self-refresh operations or modes, power-down or standby modes), while relatively higher temperatures may be beneficial for other operations or operational modes (e.g., read or write operations or related modes that support memory accesses). Further, various operations or operating modes of the memory device may be enabled or disabled based on indications of a temperature of the memory device. For example, some operations or modes may be enabled (e.g., activated, available, supported) or disabled (e.g., deactivated, unavailable, restricted) based on whether the indicated temperature of the memory device is within a corresponding (e.g., suitable, desired, target) temperature range. Power may beneficially be conserved by activating, deactivating, or otherwise operating the circuitry or other components configured to heat the memory device based on an operational mode of the memory device (e.g., power may be conserved by not heating the memory device while the memory device is in a self-refresh mode).

Features of the disclosure are initially described in the context of a memory system and a memory die as described with reference to FIGS. 1 and 2. Features of the disclosure are further described in the context of a system and temperature profiles for operating a memory device with controlled and mode-dependent heating of the memory device as described with reference to FIGS. 3 through 6B. These and other features of the disclosure are further illustrated by and described with reference to apparatus diagrams, system diagrams, and flowcharts that relate to controlled and mode-dependent heating of a memory device as described with reference to FIGS. 7 through 12.

FIG. 1 illustrates an example of a system 100 that supports controlled and mode-dependent heating of a memory device, in accordance with aspects disclosed herein. The system 100 may include an external memory controller 105, a memory device 110, and a plurality of channels 115 that couple the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device (e.g., a graphics processing unit (GPU)), a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be coupled with or in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a GPU, a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components as would be understood by persons of ordinary skill in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that may provide information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include output driver circuitry and various other circuit elements, for example, conductive lines, transistors, capacitors, inductors, resistors, amplifiers, or other active or passive elements, configured to carry out the functions described herein. For example, system 100 may include one or more temperature sensors, which may be included in or otherwise coupled with the memory device, the external memory controller 105, or other aspects of system 100. As another example, system 100 may include circuitry configured to heat the memory device 110, and such circuitry may be included in or otherwise coupled with the memory device or other aspects of system 100.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are further described with reference to FIG. 2.

The memory arrays 170 may be examples of two-dimensional (2D) arrays of memory cells or may be examples of a three-dimensional (3D) arrays of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, multiple memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs, increase the performance of the memory array, or both. In some 3D memory devices, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105.

For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120. Thus, in some cases, the device memory controller 155 or one or more local memory controllers 165 may support the operation of circuitry configured to heat the memory device 110 as described herein.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal. Thus, in some cases, the external memory controller 105 may support the operation of circuitry configured to heat the memory device 110 as described herein.

In some cases, the external memory controller 105 or other components of the system 100, or its functions described herein, may be implemented by the processor 120. For example, the external memory controller 105 may be hardware, firmware, or software, or some combination thereof implemented by the processor 120 or other component of the system 100. Although the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to adjust (e.g., oscillate) between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. For example, the channels 115 may include data channels 190-1 through 190-$n$. Each data channel may be associated with or include one or more transmission lines. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. Although the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), PAM4, and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a PAM4 symbol may represent a logic 00, a logic 01, a logic 10, or a logic 11). Examples of multi-symbol modulation schemes include, but are not limited to, PAM4, PAM8, quadrature amplitude modulation (QAM), quadrature phase shift keying (QPSK), and others. A multi-symbol signal (e.g., a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In accordance with the described techniques, the system 100 may include circuitry or other components configured to heat the memory device 110 (e.g., heat the bulk of the memory device 110, memory die 160, or memory array 170, or heat the mass or volume of the memory device 110, memory die 160, or memory array 170 in aggregate). The circuitry or other components configured to heat the memory device 110 may be activated, deactivated, or otherwise operated (e.g., by an external memory controller 105, a device memory controller 155, or a local memory controller 165) based on an indication of a temperature of the memory device 110 (e.g., generated and received from a temperature sensor associated with (e.g., include in or coupled with) the external memory controller 105, with the memory device 110, or with some other aspect of the system 100. In some examples, activating or otherwise operating the circuitry or other components configured to heat the memory device 110 may be based on an operating mode of the memory device 110, which may be associated with certain access operations or operational states of the memory device. Various operations or operating modes of the memory device 110 may also be based on indications of a temperature of the memory device 110.

Figure 2:
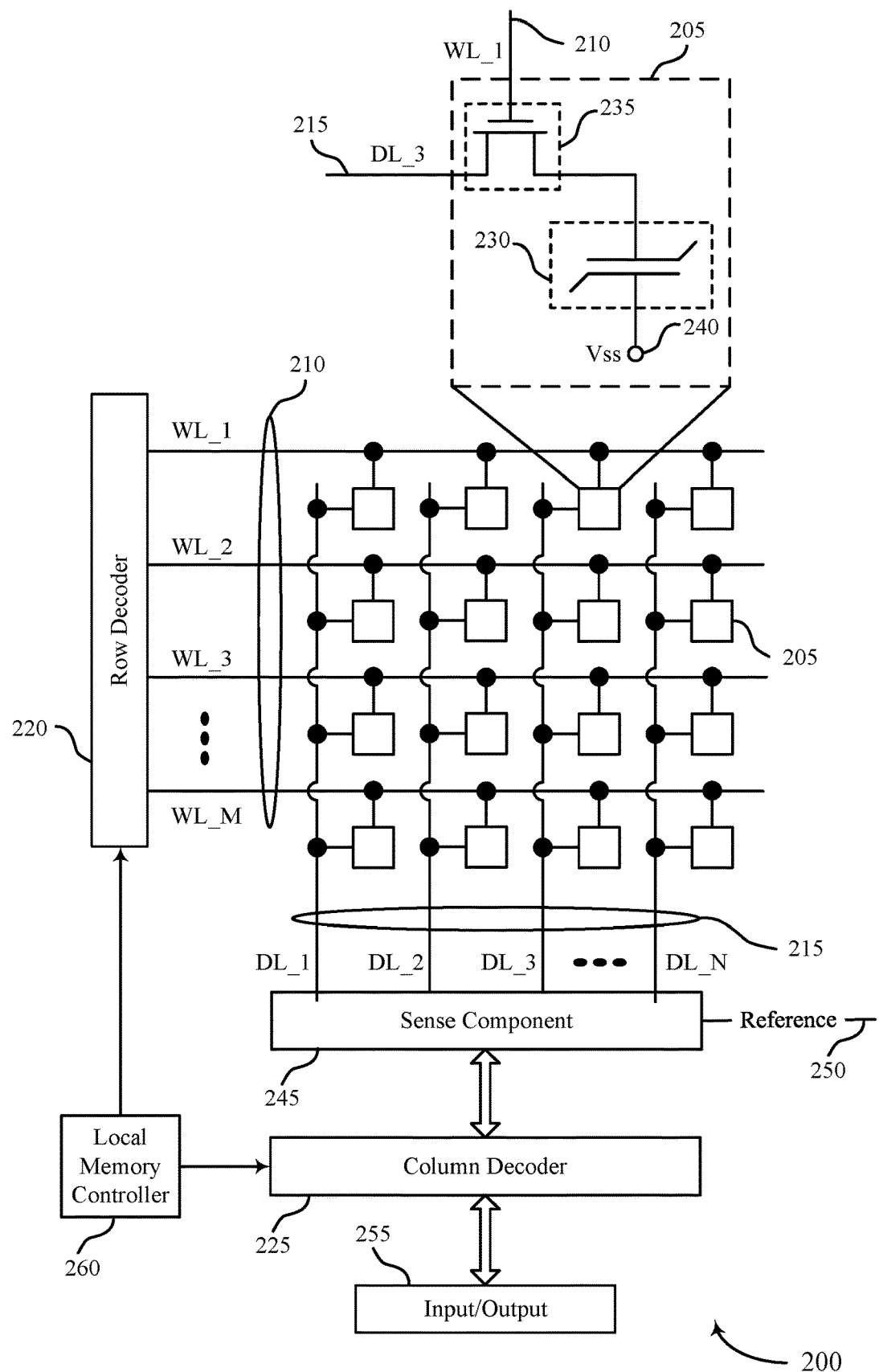
FIG. 2 illustrates an example of a memory die that supports controlled and mode-dependent heating of a memory device, in accordance with aspects disclosed herein.

FIG. 2 illustrates an example of a memory die 160-*b* that supports controlled and mode-dependent heating of a memory device, in accordance with aspects disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. In DRAM architectures, a memory cell 205 may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or de-establishes (e.g., ceases) electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 may be or include a transistor and its operation may be controlled by applying a voltage to the transistor gate, where the voltage differential between the transistor gate and transistor source may be greater or less than a threshold voltage of the transistor. In some cases, the switching component 235 may be or include a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that may be used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge.

During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0.

The sense component 245 may include various transistors or amplifiers to detect and amplify a difference in the signals. In some cases, the sense component 245 may be part of another component (e.g., a column decoder 225, row decoder 220). In some cases, the sense component 245 may be in electronic communication with the row decoder 220 or the column decoder 225.

The detected logic states of memory cells 205, as determined by the sense component 245, may be output through column decoder 225 as output 255. Output 255 may pass the detected logic states to one or more intermediary components (e.g., a local memory controller) for transfer over one or more channels (e.g., for transmission over one or more transmission lines). Thus, the detected logic state of memory cells 205 may be conveyed to devices or components external to memory die 200.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations.

The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. The write operation may be for data received from an external device. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a first signal (e.g., voltage) to the digit line 215 during the write operation to store a first state (e.g., charge) in the capacitor 230 of the memory cell 205, and the first state (e.g., charge) may be indicative of a desired logic state.

In some cases, the local memory controller 260 may be configured to perform a read operation (e.g., a sense operation) on one or more memory cells 205 of the memory die 200. The read operation may be for data requested by, or intended for, an external device. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205.

The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

The memory die 200 illustrates a two-dimensional (2D) array of memory cells. In some cases, the memory device may include three-dimensional (3D) arrays or memory cells. A 3D memory array may include two or more 2D memory arrays stacked on top of one another. In some cases, 2D memory arrays in a 3D memory array may be referred to as decks, levels, layers, or dies. A 3D memory array may include any quantity of stacked 2D memory arrays (e.g., two high, three high, four high, five high, six high, seven high, eight high). This may increase the quantity of memory cells that may be positioned on a single die or substrate as compared with a single 2D memory array, which in turn may reduce production costs, increase the performance of the memory array, or both. In some 3D memory arrays, different decks may share at least one common access line such that some decks may share at least one of a word line 210 or a digit line 215.

A system 100 or external memory controller 105 that includes or is otherwise associated with the memory die 200 (e.g., including a memory device 110 including or otherwise associated with the memory die 200) may be designed or configured to operate in a range of ambient temperatures that is different than a range of operating temperatures that would be otherwise designed or configured for the memory die 200. For example, when the system 100 or the external memory controller 105 is included in a vehicle, the vehicle may be designed to operate in relatively low ambient temperatures (e.g., an ambient temperature as low as −40° C.) which may be lower than a designed operating temperature of the memory die 200 (e.g., as low as 0° C.).

One or more operational aspects of the memory die 200 may be temperature-sensitive, and the memory die 200 or a system that includes the memory die (e.g., a system such as system 100) may be configured such that the memory device satisfies operational parameters across the ambient temperature range expected for the system 100 or external memory controller 105 that includes or is otherwise associated with the memory die 200. For example, a memory die 200 or an apparatus or system 100 that includes a memory die 200 may include circuitry or other components configured to heat the memory die 200 (e.g., circuitry configured to heat the memory die 200 or a memory device 110 that includes the memory die 200, circuitry configured to heat a memory array included in the memory die 200, circuitry configured to heat all of the memory cells 205 of the memory die 200). The circuitry or other components configured to heat the memory die 200 may be activated, deactivated, or otherwise operated based on an indication of a temperature of the memory device 110 (e.g., based on a determination to raise the temperature of the memory device 110) or a component thereof. In some examples, activating, deactivating, or otherwise operating the circuitry or other components configured to heat the memory die 200 may be based on an operating mode of a memory device 110 that includes the memory die 200, which may be associated with certain access operations or operational states of the memory device 110. Various operations or operating modes of the memory device 110 may also be based on indications of a temperature of the memory device 110 or a component thereof.

Figure 3:
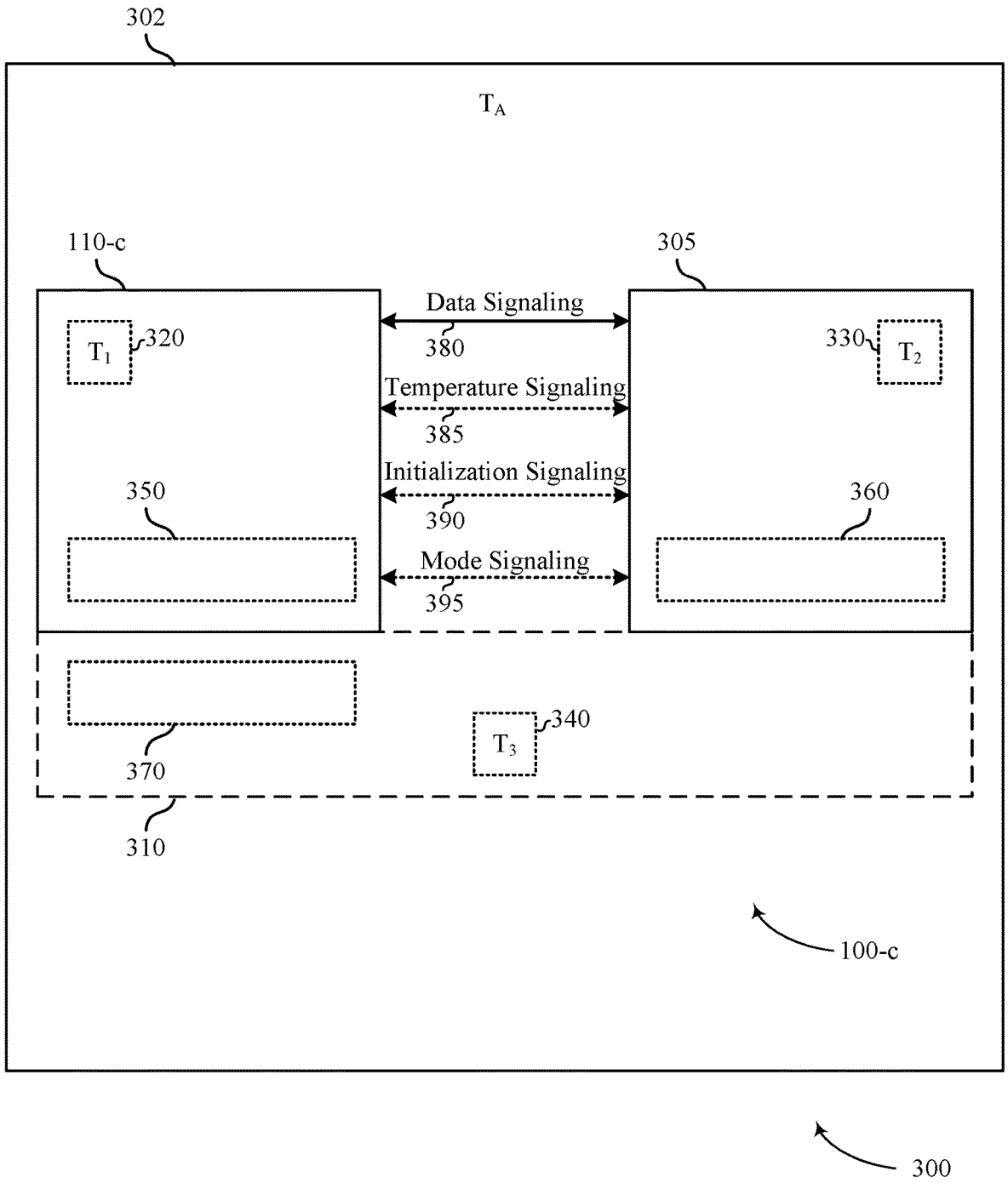
FIG. 3 illustrates an example of a system that supports controlled and mode-dependent heating of a memory device, in accordance with aspects disclosed herein.

FIG. 3 illustrates an example 300 of a system 100-c that supports controlled and mode-dependent heating of a memory device, in accordance with aspects disclosed herein. The system 100-c may include a host device 305 and a memory device 110-c, which may be examples of the respective components described with reference to FIGS. 1 and 2. Although the system 100-c is illustrated with one memory device 110 (e.g., memory device 110-c), the components and techniques described herein may be illustrative of a system 100 that includes one memory device 110 or a set of memory devices 110 (e.g., more than one memory device 110).

The system 100-c may be operating in an environment 302 having an ambient temperature (e.g., $T_A$), which may refer to an ambient temperature or range of ambient temperatures in which the system 100-c is designed to operate (e.g., an outdoor temperature, a temperature of or inside an enclosure that contains the system 100-c). In some examples, the environment 302 may be associated with an ambient temperature range that is different than an operating temperature range associated with the memory device 110-c, or different than an operating temperature range that would otherwise be configured for the memory device 110-c. For example, the system 100-c or the host device 305 may represent a vehicle, or a vehicle component (e.g., a vehicle controller, a vehicle processing unit, or an external memory controller 105 included in the vehicle), and the environment 302 (e.g., an outdoor environment, a vehicle environment, an engine compartment environment, a vehicle interior environment) may be associated with an ambient temperature range of −40° C. to 100° C., or some other temperature range. In some examples, the memory device 110-c may be designed or otherwise configured for operating temperatures between 0° C. and 100° C. In accordance with aspects disclosed herein, the system 100-c may include circuitry configured to heat the memory device 110-c (e.g., based on a determination associated with raising the temperature of the memory device 110-c), so that the memory device 110-c may perform operations at a temperature within a designed or configured operating temperature range (e.g., between 0° C. and 100° C.), even when the ambient temperature of the environment 302 is below the operating temperature (e.g., as low as −40° C.).

The system 100-c may include various temperature sensors for measuring or indicating a temperature of the memory device 110-c. In some examples, the system 100-c may include a memory device temperature sensor 320, which may be a component of the memory device 110-c. A memory device temperature sensor 320 may be embedded within (e.g., as an integral component of), or coupled to any of a device memory controller 155, a memory die 160, a local memory controller 165, a memory array 170, or any other component included in the memory device 110-c. Although shown within the illustrative boundary of the memory device 110-c, a memory device temperature sensor 320 may also be coupled to (e.g., fused to, fastened to, soldered to) an outside packaging of a memory device 110-c, which may include a thermally conductive coupling such as a thermal paste or other coupling between thermally conductive materials. A memory device temperature sensor 320 may provide a relatively direct measurement or indication of a temperature of the memory device 110-c, or component thereof (e.g., a temperature $T_1$). In some examples, an acquisition rate (e.g., a rate of determining a temperature indication) associated with a memory device temperature sensor 320 may be linked to operations of the memory device 110-c, such as refresh or auto-refresh (AREF) commands, and may occur according to a configured interval (e.g., every 1.9 μs).

Additionally or alternatively, the system 100-c may include a host device temperature sensor 330, which may be a component of the host device 305. A host device temperature sensor 330 may be embedded within (e.g., as an integral component of), or coupled to an external memory controller 105, or where such components are included in the host device 305, a host device temperature sensor 330 may be embedded within or coupled to a processor 120, a BIOS component 125, a peripheral component 130, or an I/O controller 135. Although shown within the illustrative boundary of the host device 305, a host device temperature sensor 330 may also be coupled to (e.g., fused to, fastened to, soldered to) an outside packaging of a host device 305, which may include a thermally conductive coupling such as a thermal paste or other coupling between thermally conductive materials. The host device temperature sensor 330 may provide a relatively direct measurement or indication of a temperature of the host device 305, or component thereof (e.g., a temperature $T_2$), which in some examples or conditions, may provide a suitable measurement or indication of a temperature of the memory device 110-c (e.g., a relatively indirect measurement or indication) for supporting the techniques described herein.

In some examples the host device 305 and the memory device 110-c may be coupled via a coupling component 310, but in various examples of the system 100-c, the coupling component 310, or described functions thereof, may be included in the system 100-c or omitted from the system 100-c. The coupling component 310 may be a physical component of the system 100-c that provides a coupling between the host device 305 and the memory device 110-c. The described coupling may include a thermal coupling that conveys thermal energy between the host device 305 and the memory device 110-c. For example, the coupling component 310 may have a relatively high thermal conductivity (e.g., low thermal resistance), which may facilitate heat energy transfer between the host device 305 and the memory device 110-c at relatively small temperature differences between the host device 305 and the memory device 110-c. In other words, the coupling component 310 may support the host device 305 and the memory device 110-c being at relatively similar temperatures (e.g., via a relatively strong thermal coupling).

By coupling the memory device 110-c with the host device 305 via a coupling component 310 (e.g., via a thermal coupling), the host device temperature sensor 330 may provide a more accurate indication of the temperature of the memory device 110-c than when the coupling component 310 is omitted. For example, when the system 100-c includes the coupling component 310, the host device temperature sensor 330 may provide a more accurate indication of memory device temperature during thermal transients, or when internal heat generation of the memory device 110-c is different than internal heat generation of the host device 305. However, in some examples a coupling component 310 may be omitted from the system 100-c, and the host device temperature sensor 330 may be suitable for supporting the techniques described herein.

In some examples, the coupling component 310 may be specifically configured to reduce temperature differences between the host device temperature sensor 330 and the memory device 110-c. For example, the coupling component 310 may be a particularly-designed thermal bridge or linkage between the host device temperature sensor 330 or the host device 305 and the memory device 110-c, such as a thermally conductive trace or pad of a substrate (e.g., a conductive portion of a printed circuit board that both the memory device 110-c and the host device 305 are coupled with). In some examples, the coupling component 310 may be configured for other purposes, but otherwise supports thermal conduction between the memory device 110-c and the host device 305. For example, the coupling component 310 may be a heat sink or cooling fins configured to draw heat energy away from the memory device 110-c or the host device 305, and may additionally limit temperature differences between the memory device 110-c and the host device 305 (e.g., as a secondary or additional purpose of the coupling component 310). In some examples, the coupling component 310 may also refer to a conductive trace of a printed circuit board or other interfacing component configured to communicate signals between the memory device 110-c and the host device 305 (e.g., signal paths associated with one or more channels 115).

Although the coupling component 310 is illustrated as a separate component from the memory device 110-c and the host device 305, in various examples of the system 100-c, the coupling component 310, or the described characteristics thereof, may be included in one or both of the memory device 110-c or the host device 305. For example, the memory device 110-c may include one or more memory dice 160 mounted to a printed circuit board or other substrate, and the printed circuit board of the memory device 110-c may include a thermally conductive portion that is configured to, or otherwise supports an exchange of thermal energy between the memory device 110-c and the host device 305, thereby reducing temperature differences between the memory device 110-c and a host device temperature sensor 330-c. Additionally or alternatively, the host device 305 may include a printed circuit board, and the printed circuit board of the host device 305 may include a thermally conductive portion that is configured to, or otherwise supports an exchange of thermal energy between the host device 305 and the memory device 110-c, thereby limiting temperature differences between the memory device 110-c and a host device temperature sensor 330-c.

For a system 100-c that includes the coupling component 310, the system 100-c may include a coupling component temperature sensor 340 (e.g., in addition to, or as an alternative to one or both of a memory device temperature sensor 320 or a host device temperature sensor 330), which may be a component of the coupling component 310. A coupling component temperature sensor 340 may be embedded within (e.g., as an integral component of), or otherwise coupled to a coupling component 310, which may include a thermally conductive coupling such as a thermal paste or other coupling between thermally conductive materials. The coupling component temperature sensor 340 may provide a relatively direct measurement or indication of a temperature of the coupling component 310 (e.g., a temperature $T_3$), which in some examples or conditions, may provide a suitable measurement or indication of one or both of a temperature of the memory device 110-c or a temperature of the host device 305 (e.g., a relatively indirect measurement or indication). In various examples, a coupling component temperature sensor 340 may be in communication with (e.g., may provide a temperature indication to) the memory device 110-c, or the host device 305, or both.

Although illustrated as single components, any one or more of a memory device temperature sensor 320, a host device temperature sensor 330, or a coupling component temperature sensor 340 may be repeated in the system 100-c. For example, the memory device 110-c may include a set of memory device temperature sensors 320 distributed across multiple memory dice 160, or otherwise distributed across different locations of the memory device 110-c. Additionally or alternatively, the host device 305 may include a set of host device temperature sensors 330 distributed across various components of the host device 305, or otherwise distributed across different locations of the host device 305. Additionally or alternatively, the coupling component 310 may include a set of coupling component temperature sensors 340 distributed across various components of the coupling component 310, or otherwise distributed across different locations of the coupling component 310.

In various examples, multiple temperature sensors may be used in the system 100-c to provide aggregated indications (e.g., an average or otherwise aggregated temperature indication of a particular memory device 110-c, an average or otherwise aggregated temperature of a set of memory devices 110-c, an average or otherwise aggregated temperature of the system 100-c), minimum or maximum indications (e.g., a minimum or maximum temperature of a particular memory device 110-c, a minimum or maximum temperature of a set of memory devices 110-c, a minimum or maximum temperature of the system 100-c), or plausibility indications (e.g., an indication that may be used to detect whether a temperature sensor has failed, is faulted, or is otherwise providing an implausible temperature indication), or various combinations thereof.

In various examples, multiple temperature sensors may be used in the system 100-c to support offset determinations, cross-calibration, or other processing of an indication of one temperature sensor based on an indication of another temperature sensor. In one example, the host device 305 or the memory device 110-c (e.g., an external memory controller 105 or a device memory controller 155) may identify an offset or scaling difference between temperature sensors of the same device (e.g., between host device temperature sensors 330, between memory device temperature sensors 320), and may apply the offset or scaling to temperature sensors of the same device (e.g., as an addition or subtraction of the identified offset or scaling difference, as an addition or subtraction of some proportion or weighted amount of the identified offset or scaling difference), which may be an example of a cross-calibration of temperature sensors within the same device of the system 100-c. In another example, the host device 305 or the memory device 110-c (e.g., an external memory controller 105 or a device memory controller 155) may identify an offset or scaling difference between a memory device temperature sensor 320 and a host device temperature sensor 330, and may apply the offset or scaling difference to one or both of an indication from the memory device temperature sensor 320 or an indication from the host device temperature sensor 330 (e.g., as an addition or subtraction of the identified offset or scaling difference, as an addition or subtraction of some proportion or weighted amount of the identified offset or scaling difference), which may be an example of a cross-calibration of temperature sensors across different devices of the system 100-c.

In some examples, the host device 305 or the memory device 110-c (e.g., an external memory controller 105 or a device memory controller 155) may identify a difference between an indicated temperature of the memory device 110-c and an indicated temperature of the host device 305, and the host device 305 or the memory device 110-c may perform described operations or exchanged commands or signaling based on the identified difference. For example, the host device 305 may identify a difference (e.g., an offset) between a memory device temperature sensor 320 and a host device temperature sensor 330, and the host device 305 may apply the identified difference (e.g., by addition or subtraction) to later indications of the host device temperature sensor 330 to estimate an indication of the memory device temperature sensor 320, and perform operations based on the estimated indication of the memory device temperature sensor 320.

In some cases, an offset between a temperature of one device and a temperature of another device (e.g., between the temperature of the host device 305 and the temperature of the memory device 110-c, between the temperature of the coupling component 310 and the temperature of the memory device 110-c) may be preconfigured at the host device 305 or the memory device 110-c (e.g., stored in one or more fuses or anti-fuses), and the host device 305 or the memory device 110-c may use such a preconfigured offset identified as described herein.

A memory device temperature sensor 320, a host device temperature sensor 330, or a coupling component temperature sensor 340 may include various types of components that provide an indication of temperature, and such indications may be conveyed, signaled, compared, or otherwise processed in a digital domain or an analog domain. For example, any one or more of a memory device temperature sensor 320, a host device temperature sensor 330, or a coupling component temperature sensor 340 may include a thermocouple, a thermistor, a semiconductor temperature sensor, a resistance temperature detector (RTD), or some other type of sensor.

In some examples, a set of temperature sensors of a particular component of the system 100-c may be a same type of sensor. For example, each of a set of memory device temperature sensors 320 of a memory device 110-c may be semiconductor temperature sensors. In some examples, a component of the system 100-c may have multiple types of temperatures sensors, which may support different temperature ranges, different operating conditions (e.g., different operating modes, different power consumption, different portions of a component being energized), redundancy, or plausibility detection. For example, the memory device temperature sensors 320 of a memory device 110-c may include a set of thermocouples and one or more RTDs.

In various examples, components of the system 100-c may use the same or different types of temperature sensors. For example, the memory device temperature sensor 320 a memory device 110-c may include a thermocouple, and the host device temperature sensor 330 of a host device 305 may include a thermocouple, or an RTD, or both. Various other combinations of temperature sensor types may be used in memory device temperature sensors 320, host device temperature sensors 330, or coupling component temperature sensors 340 in accordance with the described techniques.

The system 100-c may also include various circuitry or components configured to heat the memory device 110-c. In some examples, the system 100-c may include a memory device memory heater 350, which may be a component of the memory device 110-c. A memory device memory heater 350 may be embedded within (e.g., as an integral component of), or coupled to any of a device memory controller 155, a memory die 160, a local memory controller 165, a memory array 170, or any other component included in the memory device 110-c. For example, a memory device memory heater 350 may include a resistive element or a resistive path (e.g., trace, wire, or electrode) that converts electrical energy into thermal energy (e.g., via ohmic heating). In some examples, a memory device memory heater 350 may include a switching component configured to couple a voltage source with a ground, a chassis ground, or some other voltage source that supports current flow. Such resistive elements, resistive paths, grounds, voltage sources, or switching components may be associated with one or more various components of the memory device 110-c (e.g., a device memory controller 155, a memory die 160, a local memory controller 165, a memory array 170).

In some examples, a switching component included in circuitry configured to heat the memory device 110-c may be configured to selectively couple two access lines (e.g., via a resistive element, via a resistive path, via a short circuit) associated with a memory array 170. In some examples the memory device 110-c may be configured to perform dummy operations (e.g., dummy access operations, access operations not associated with an exchange of information with the host device 305) that are configured to heat the memory device 110-c (e.g., configured for raising a bulk temperature of a memory array 170, configured to raise a temperature of a plurality of memory cells 205 of a memory array 170, operations responsive to a determination to raise a temperature of the memory device 110-c), in which case the memory device memory heater 350 may include portions of a local memory controller 165, a memory array 170, or both. In some examples, a memory device memory heater 350 may include circuitry configured to heat the memory device 110-c that is not used for access operations (e.g., components configured for heating the memory device 110-c that are not used in access operations of the memory device 110-c).

Although shown within the illustrative boundary of the memory device 110-c, a memory device memory heater 350 may also be coupled to (e.g., fused to, fastened to, soldered to) an outside packaging of a memory device 110-c, which may include a thermally conductive coupling such as a thermal paste or other coupling between thermally conductive materials. A memory device memory heater 350 may provide a relatively direct heating of the memory device 110-c.

Additionally or alternatively, the system 100-c may include a host device memory heater 360, which may be a component of the host device 305. A host device memory heater 360 may be embedded within (e.g., as an integral component of), or coupled to an external memory controller 105, or where such components are included in the host device 305, a host device memory heater 360 may be embedded within or coupled to a processor 120, a BIOS component 125, a peripheral component 130, or an I/O controller 135. In some examples, a host device memory heater 360 may include a resistive element or a resistive path (e.g., trace, wire, or electrode) that converts electrical energy into thermal energy (e.g., via ohmic heating) Although shown within the illustrative boundary of the host device 305, a host device memory heater 360 may also be coupled to (e.g., fused to, fastened to, soldered to) an outside packaging of a host device 305, which may include a thermally conductive coupling such as a thermal paste or other coupling between thermally conductive materials. The host device memory heater 360 may provide a relatively direct heating of the host device 305, which in some examples or conditions, may provide heating suitable to raise a temperature of the memory device 110-c (e.g., a relatively indirect heating) for supporting the techniques described herein.

For a system 100-c that includes the coupling component 310, the system 100-c may include a coupling component memory heater 370 (e.g., in addition to, or as an alternative to one or both of a memory device temperature sensor 320 or a host device temperature sensor 330), which may be a component of the coupling component 310. A coupling component memory heater 370 may be embedded within (e.g., as an integral component of), or otherwise coupled to a coupling component 310, which may include a thermally conductive coupling such as a thermal paste or other coupling between thermally conductive materials. In some examples, a coupling component memory heater 370 may include a resistive element or a resistive path that converts electrical energy into thermal energy (e.g., via ohmic heating). In some examples, a coupling component memory heater 370 may refer to a circulating fluid or fluid path that is typically associated with a cooling function (e.g., when the coupling component 310 includes heat sink or manifold associated with a liquid cooling system), but may be configured under certain conditions to provide heating to the memory device 110-c (e.g., when fluid of a fluid source has a higher temperature than the memory device 110-c). The coupling component memory heater 370 may provide a relatively direct heating of the coupling component 310, which in some examples or conditions, may provide heating suitable to raise a temperature of the memory device 110-*c* or the host device 305 (e.g., a relatively indirect heating). In various examples, a coupling component memory heater 370 may be in communication with (e.g., receive control commands from, receive activation commands from, receive deactivation commands from) the memory device 110-*c*, or the host device 305, or both.

Although illustrated as single components, any one or more of a memory device memory heater 350, a host device memory heater 360, or a coupling component memory heater 370 may be repeated in the system 100-*c*. For example, the memory device 110-*c* may include a set of memory device memory heaters 350 distributed across multiple memory dice 160, distributed within each memory die 160, or otherwise distributed across different locations of the memory device 110-*c*. Additionally or alternatively, the host device 305 may include a set of host device memory heaters 360 distributed across various subcomponents of the host device 305 or otherwise distributed across different locations of the host device 305. Additionally or alternatively, the coupling component 310 may include a set of coupling component memory heaters 370 distributed across various subcomponents of the coupling component 310, or otherwise distributed across different locations of the coupling component 310. In various examples, multiple memory heaters may be used to support relatively homogeneous heating (e.g., distributed heat flow), relatively homogeneous component temperature (e.g., minimizing or reducing hot spots or cold spots across or within components), specific heating of certain components or subcomponents (e.g., heating of active portions of a memory device 110, heating of active or targeted memory devices 110), or various combinations thereof.

The system 100-*c* may also include various signaling between the memory device 110-*c* and the host device 305 (e.g., an external memory controller 105 of the host device 305), which may support various operations of or between the memory device 110-*c* and the host device 305. For example, the system 100-*c* may support data signaling 380, temperature signaling 385, initialization signaling 390, mode signaling 395, or various combinations thereof. Each of the described signaling may be conveyed via channels 115, such as those described with reference to the system 100 of FIG. 1.

Data signaling 380 may include bidirectional data exchange, such as data conveyed as part of reading or writing memory cells 205 of the memory device 110-*c*. Data signaling 380 may be conveyed, for example, over a data channel 190 as described with reference to the system 100 of FIG. 1, or some other operational channel or line between the memory device 110-*c* and the host device 305.

Temperature signaling 385 may include various indications of temperatures communicated between the memory device 110-*c* or the host device 305, and may be conveyed over a data channel 190, or an EDC pin or Joint Test Action Group (JTAG) signal associated with an other channel 192, such as those described with reference to system 100 of FIG. 1, or some other temperature feedback channel or line. For example, the memory device 110-*c* and the host device 305 may exchange explicit indications of temperature (e.g., digital values conveying a temperature in degrees Fahrenheit or degrees Celsius) or implicit indications of temperature (e.g., a voltage of a thermocouple, or a voltage or current across an RTD that is otherwise associated with a particular temperature in degrees Fahrenheit or degrees Celsius). The memory device 110-*c*, for example, may provide an indication of a temperature of the memory device 110-*c* (e.g., from a memory device temperature sensor 320) to the host device 305 via temperature signaling 385. The host device 305, for example, may provide an indication of a temperature of the host device 305 (e.g., from a host device temperature sensor 330) to the memory device 110-*c* via temperature signaling 385. Such temperature signaling may be used to support various examples of the described techniques for controlled and mode-dependent heating of a memory device.

Initialization signaling 390 may include various indications of initialization operations or triggers for initialization performed by the memory device 110-*c* or the host device 305, and may be conveyed over a data channel 190, or an EDC pin or JTAG signal associated with an other channel 192 (e.g., a power channel), as described with reference to system 100 of FIG. 1, or some other initialization feedback channel or line. For example, initialization may be triggered by power being turned on or otherwise provided to the system 100-*c* (e.g., via an input 145), or the host device 305 otherwise activating or enabling the memory device 110-*c*. In some examples, the initialization signaling 390 may include power being provided to the memory device 110-*c* (e.g., via a power channel), or may include an explicit command to the memory device 110-*c* to perform an initialization, either or both of which may trigger an initialization of the memory device 110-*c*. In some examples, upon power being provided to the memory device 110-*c*, the memory device 110-*c* may perform an initialization without signaling from the host device 305, but may provide an indication to the host device 305 that the memory device 110-*c* is performing an initialization operation (e.g., via initialization signaling 390). In some examples, initialization may be performed by the memory device 110-*c* or the host device 305 from an idle state or standby state (e.g., when exiting an idle state or standby state), which may be triggered by initialization signaling 390 whether or not there is a transition in power provided to the memory device 110-*c* or the host device 305.

Mode signaling 395 may include various indications of operating modes that the memory device 110-*c* or the host device 305 are operating in, and may be conveyed over a data channel 190, or an EDC pin or JTAG signal associated with an other channel 192, as described with reference to system 100 of FIG. 1, or some other mode feedback channel or line.

A first operating mode (e.g., a refresh mode, a self-refresh mode) may be associated with refresh operations or self-refresh operations of the memory device 110-*c*, which may include periodic refreshing of logic states stored by memory cells 205 of the memory device 110-*c*. During the first mode, the memory device 110-*c* may not be performing, or may not be available for performing read or write operations. Accordingly, the first mode may be associated with a lack of data transfer between the memory device 110-*c* and the host device 305 (e.g., an operating mode associated with an absence of data signaling 380).

In some examples, operating in the first mode may be triggered by an indication of a temperature of the memory device 110-*c* (e.g., when the first mode is associated with a relatively lower-temperature mode or a relatively higher-temperature mode), or the first mode may be associated with operations that are configured based on an indication of a temperature of the memory device 110-*c* (e.g., when the first mode is associated with relatively lower-temperature operations or relatively higher-temperature operations). For example, the first mode may be associated with a relatively lower-temperature mode and may include or support refresh or self-refresh operations, as leakage rate may be reduced (slower) at the lower temperatures (e.g., memory cells 205 may exhibit longer retention times of stored logic states). In various examples, the mode signaling 395 may include the memory device 110-c indicating to the host device 305 that the memory device 110-c is operating in the first mode (e.g., that the memory device 110-c is unavailable for access commands or operations), or the mode signaling 395 may include the host device 305 commanding that the memory device 110-c enter the first mode (e.g., a command to operate according to the first mode).

A second operating mode (e.g., a read/write mode) may be associated with relatively higher-temperature operations and may include or support read operations of the memory device 110-c, write operations of the memory device 110-c, or both. Accordingly, the second mode may be associated with a presence of data transfer between the memory device 110-c and the host device 305 (e.g., an operating mode associated with a presence of data signaling 380).

In some examples, operating in the second mode may be triggered by an indication of a temperature of the memory device 110-c (e.g., when the second mode is associated with a relatively lower-temperature mode or a relatively higher-temperature mode), or the second mode may be associated with operations that are configured based on an indication of a temperature of the memory device 110-c (e.g., when the second mode is associated with relatively lower-temperature operations or relatively higher-temperature operations). For example, when the second mode is associated with certain access operations (e.g., read operations, write operations), such operations may be performed more quickly, efficiently, or reliably when the memory device 110-c is at a relatively higher temperature (e.g., within an operating temperature range, which may be higher than an ambient temperature of the environment 302). Accordingly, operating in the second mode may be associated with a temperature that is reached based at least in part on heating of the memory device 110-c under certain conditions. In various examples, the mode signaling 395 may include the memory device 110-c indicating to the host device 305 that the memory device 110-c is operating in the second mode (e.g., that the memory device 110-c is available for access operations or commands), or the mode signaling 395 may include the host device 305 commanding that the memory device 110-c enter the second mode, which may include a request to access the memory device 110-c. In some examples when operating in the second mode, the memory device 110-c may provide a "ready to operate" signal via the mode signaling 395.

Although described with reference to a first mode and a second mode, the techniques described herein may be applied to any number of type of modes, such as low or high power modes, idle modes, standby modes, high-performance modes, energy saving modes, and others. In other words, controlled and mode-dependent heating of the memory device 110-c may generally support memory temperature being aligned to an access type, such as allowing or enabling relatively lower temperatures for refresh operations with lower power consumption, or relatively higher temperatures for read or write operations with higher performance (e.g., increased data throughput, efficiency, or reliability). In various examples, operational modes may be selected, activated (allowed, available, supported), or deactivated (disallowed, unavailable, restricted) based on indicated temperatures (e.g., temperatures before, while, or after heating the memory device 110-c).

Thus, the system 100-c may be configured to activate, deactivate, or otherwise control one or more of a memory device memory heater 350, a host device memory heater 360, or a coupling component memory heater 370 based on various indications of a temperature of the memory device 110-c (e.g., from one or more of a memory device temperature sensor 320, a host device temperature sensor 330, a coupling component temperature sensor 340, or a combination thereof). In some examples, such control of a memory heater by the system 100-c may be based at least in part on one or more of data signaling 380, temperature signaling 385, initialization signaling 390, or mode signaling 395, or some combination thereof, or such control of a memory heater by the system 100-c may be otherwise accompanied by such signaling.

Figure 4:
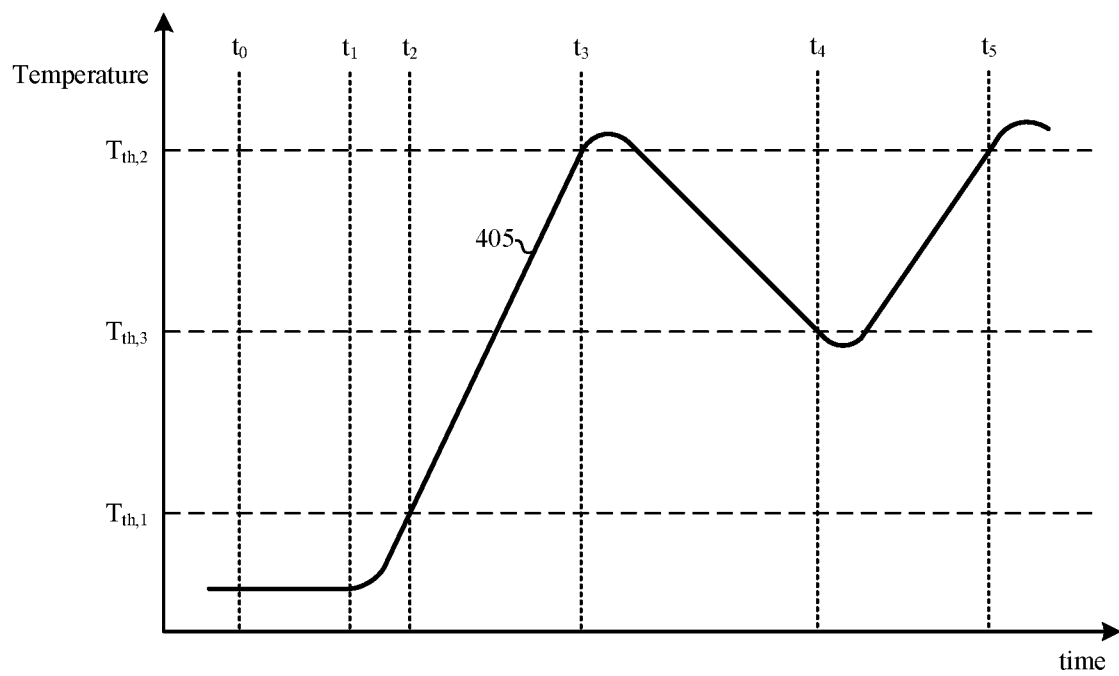
FIG. 4 illustrates an example of a temperature profile associated with controlled and mode-dependent heating of a memory device, in accordance with aspects disclosed herein.

FIG. 4 illustrates an example of a temperature profile 400 associated with controlled and mode-dependent heating of a memory device 110, in accordance with aspects disclosed herein. The temperature profile 400 may illustrate an example of an indicated temperature 405 of the memory device 110-c when performing controlled and mode-dependent heating in the system 100-c described with reference to FIG. 3. In various examples, the indicated temperature 405 may be illustrative of a temperature indicated at the memory device 110-c (e.g., $T_1$, as indicated by one or more memory device temperature sensors 320), a temperature indicated at the host device 305 (e.g., $T_2$, as indicated by one or more host device temperature sensors 330), a temperature indicated at the coupling component 310 (e.g., $T_3$, as indicated by one or more coupling component temperature sensors 340), or some combination thereof. In some examples, the indicated temperature 405 may be illustrative of an average indicated temperature of a set of temperature sensors, a minimum indicated temperature of a set of temperature sensors, a maximum indicated temperature of a set of sensors, or some other combination or operation applied to a set of temperature sensors.

At $t_0$, the system 100-c, the host device 305, or the memory device 110-c may be in a standby, idle, or powered-down state or mode. In some examples, at $t_0$, the memory device 110-c may not be performing read operations, write operations, or other access operations. In some examples, the system 100-c, the host device 305, or the memory device 110-c may not be receiving power (e.g., from a power source of the system 100-c or the host device 305, or from an input 145). In an example where the system 100-c or the host device 305 is a vehicle, prior to $t_0$, the vehicle may be turned off, in a mode where the ignition system or other power or propulsion system is disabled or otherwise restricted, or some other mode where the vehicle or some subsystem of the vehicle is powered down or operating in a low-power or idle state.

The indicated temperature 405 at $t_0$ may be equal to the ambient temperature $T_A$ associated with the environment 302. In other words, the system 100-c, the host device 305, or the memory device 110-c may have reached thermal equilibrium with the environment 302, where an indicated temperature of the memory device 110-c is equal to $T_A$. In other examples, the indicated temperature 405 may not have reached an equilibrium with the environment 302, but the indicated temperature 405 may otherwise have reached a relatively low temperature (e.g., below a threshold, outside an operating temperature range).

The indicated temperature 405 at $t_0$ may be below or outside an operational temperature range associated with the memory device 110-c. For example, temperature $T_{th,1}$ may represent a first threshold (e.g., a lower threshold or boundary of the operational temperature range) associated with the memory device 110-c. In some examples, the first threshold $T_{th,1}$ may be 0° C., but other examples may include a first threshold at a different temperature (e.g., a higher or lower temperature then 0° C.).

At $t_1$, the indicated temperature 405 may be determined at $t_1$ by one or more components of the system 100-c, and because the indicated temperature 405 is at or below or otherwise satisfies the first threshold $T_{th,1}$, the system 100-c may initiate heating of the memory device 110-c according to various techniques, which in some examples may include the system 100-c preheating the memory device 110-c before performing certain access operations. In other words, heating of the memory device 110-c may be initiated responsive to a determination that a temperature (e.g., a bulk temperature, an aggregated temperature) of the memory device 110-c should be elevated.

Accordingly, following one or more of the operations at $t_1$, the indicated temperature 405 may rise. In some examples, the system 100-c, the host device 305, or the memory device 110-c may change to a different operational mode or state as part of the operations of $t_1$, which may be associated with an initialization. For example, any one or more of the system 100-c, the host device 305, or the memory device 110-c may receive power (e.g., via a power channel), or may receive some other signaling to command a change or trigger a change in operational mode or state (e.g., via initialization signaling 390 or mode signaling 395), and circuitry configured to heat the memory device 110-c may be activated in response. In examples where the indicated temperature 405 is not below the first threshold $T_{th,1}$ at $t_1$, the system 100-c may proceed with access operations without activating circuitry configured to heat the memory device 110-c, but may activate the circuitry configured to heat the memory device 110-c if the indicated temperature 405 falls (e.g., based on a comparison between the indicated temperature 405 and a third threshold $T_{th,3}$, such as operations described with reference to $t_4$).

In a first example of $t_1$, the memory device 110-c may receive power, receive an initialization command, or both. For example, where the system 100-c or the host device 305 is a vehicle, $t_1$ may be indicative of an ignition system, a propulsion system, or some other system of the vehicle being activated or initialized. In response the memory device 110-c may initialize the memory device 110-c (e.g., the memory device 110-c may perform an initialization operation). As part of the initialization of $t_1$, or otherwise based on the change in mode or state of the memory device 110-c (e.g., based on the memory device 110-c detecting an initialization), the memory device 110-c may determine the indicated temperature 405 (e.g., from one or more memory device temperature sensors 320), and compare or otherwise evaluate the indicated temperature 405 to the first threshold $T_{th,1}$ (e.g., determining that the indicated temperature 405 is at or below or otherwise satisfies the first threshold $T_{th,1}$). Based on the comparison or evaluation, the memory device 110-c may activate, enable, or otherwise control circuitry or other components configured to heat the memory device 110-c (e.g., activating one or more memory device memory heaters 350, sending a command to activate one or more host device memory heaters 360 or one or more coupling component memory heaters 370). In some examples, based on one or more of the operations of $t_1$ (e.g., based on detecting an initialization) the memory device 110-c may indicate (e.g., to the host device 305) that the memory device 110-c is in an initialization mode or that the memory device 110-c is being heated, or indicate a restriction of access operations for the memory device 110-c (e.g., that the memory device 110-c is unavailable for read or write commands, that read or write operations are disabled for the memory device 110-c). In some examples, such indications may be conveyed via initialization signaling 390, mode signaling 395, or some other signaling such as an EDC or JTAG signal or data line.

In a second example of $t_1$, the host device 305 may receive power, receive an initialization command, or both. In response, the host device 305 may perform initialization operations of the host device 305, which may include initializing the memory device 110-c (e.g., via initialization signaling 390, via mode signaling 395). As part of the initialization at $t_1$, or otherwise based on the change in mode or state of the host device 305, the host device 305 may determine or otherwise receive signaling associated with the indicated temperature 405 (e.g., from one or more host device temperature sensors 330 or coupling component temperature sensors 340, via temperature signaling 385 indicating a temperature of the memory device 110-c), and compare or otherwise evaluate the indicated temperature 405 to the first threshold $T_{th,1}$ (e.g., determining that the indicated temperature 405 is at or below or otherwise satisfies the first threshold $T_{th,1}$). In other examples, the host device 305 may otherwise identify or determine that the temperature of the memory device 110-c is at or below or otherwise satisfies the first threshold $T_{th,1}$ (e.g., via initialization signaling 390 or mode signaling 395 indicating that a temperature of the memory device 110-c is at or below or otherwise satisfies a threshold). Based on the comparison or other identification or determination of $t_1$, the host device 305 may activate, enable, or otherwise control circuitry or other components configured to heat the memory device 110-c (e.g., activating one or more host device memory heaters 360, sending a command to activate one or more memory device memory heaters 350 or one or more coupling component memory heaters 370). In examples where the system 100-c includes multiple memory devices 110, the host device may activate circuitry configured to heat all of the memory devices 110, or activate circuitry configured to heat a subset of the memory devices 110, with such a subset selected based on operating conditions, types of memory devices 110, types of data to be exchanged with memory devices 110, types of access operations, and other considerations.

In some examples (e.g., according to the second example of $t_1$), based on one or more of the operations of $t_1$, the memory device 110-c may indicate (e.g., to the host device 305) that the memory device 110-c is in an initialization mode or that the memory device 110-c is being heated, or indicate a restriction of access operations for the memory device 110-c (e.g., that the memory device 110-c is unavailable for read or write commands, that read or write operations are disabled for the memory device 110-c). In some examples, the host device 305 may otherwise understand or recognize that the memory is unavailable for access operations (e.g., based on temperature signaling 385 from the memory device 110-c, based on sending an initialization command via initialization signaling 390, based on not receiving a "ready to operate" signal). Accordingly, based on one or more of the operations of $t_1$, the host device may suppress one or more commands to access the memory device after $t_1$.

At $t_2$, the indicated temperature 405 may cross the first threshold $T_{th,1}$ (e.g., based on heating or operation of the memory device 110-c). In some examples, the first threshold $T_{th,1}$ may be a lower operating threshold of the memory device 110-c. The indicated temperature 405 may be determined at $t_2$ by one or more components of the system 100-c, and because the indicated temperature 405 is at or above or otherwise satisfies the first threshold $T_{th,1}$, the memory device 110-c may become available for access operations (e.g., read operations, write operations). Although the indicated temperature of the memory device 110-c may be at or above or otherwise satisfies the first threshold $T_{th,1}$, the heating of the memory device 110-c may continue through $t_2$ (e.g., when a different threshold is used to disable, deactivate, or otherwise control memory heating).

In a first example of $t_2$, the memory device 110-c may determine the indicated temperature 405 (e.g., from one or more memory device temperature sensors 320), and compare or otherwise evaluate the indicated temperature 405 to the first threshold $T_{th,1}$ (e.g., determining that the indicated temperature 405 is at or above or otherwise satisfies the first threshold $T_{th,1}$). Based on the comparison or evaluation of $t_2$, the memory device 110-c may transition to an active or enabled state (e.g., ceasing a restriction of access operations), which may be accompanied by the memory device 110-c signaling (e.g., to the host device 305, via mode signaling 395) that the memory device 110-c is available for access operations (e.g., via a "ready-to-operate" signal).

In a second example of $t_2$, the host device 305 may determine or otherwise receive signaling associated with the indicated temperature 405 (e.g., from one or more host device temperature sensors 330 or coupling component temperature sensors 340, via temperature signaling 385 indicating a temperature of the memory device 110-c), and compare or otherwise evaluate the indicated temperature 405 to the first threshold $T_{th,1}$ (e.g., determining that the indicated temperature 405 is at or above or otherwise satisfies the first threshold $T_{th,1}$). In other examples, the host device 305 may otherwise identify or determine that the temperature of the memory device 110-c is at or above or otherwise satisfies the first threshold $T_{th,1}$ (e.g., via initialization signaling 390 or mode signaling 395 indicating that a temperature of the memory device 110-c is at or above or otherwise satisfies a threshold). Based on the comparison or other identification or determination of $t_2$ (e.g., based on an indication that the memory device is available, based on receiving a "ready-to-operate" signal), the host device 305 may proceed with issuing or transmitting commands (e.g., via data signaling 380) to access the memory device.

At $t_3$, the indicated temperature 405 may cross a second threshold $T_{th,2}$ (e.g., based on heating or operation of the memory device 110-c). In some examples, the second threshold $T_{th,2}$ may be a threshold of the memory device 110-c that is different than a lower threshold of an operating temperature range of the memory device 110-c (e.g., different than $T_{th,1}$, greater than $T_{th,1}$). In some examples, the second threshold $T_{th,2}$ may be 10° C., but other examples may include a second threshold at a different temperature (e.g., a higher or lower temperature then 10° C.).

In some examples, the second threshold $T_{th,2}$ may be configured, set, or selected to reduce the rate or duty cycle of memory heating being enabled and disabled (e.g., when the second threshold $T_{th,2}$ is different than the first threshold $T_{th,1}$). Accordingly, the different first threshold $T_{th,1}$ and the second threshold $T_{th,2}$, or the band between the first threshold $T_{th,1}$ and the second threshold $T_{th,2}$, may be referred to as a temperature hysteresis range or hysteresis band associated with heating the memory device 110-c. Although the second threshold $T_{th,2}$ is described as being different than the first threshold $T_{th,1}$, in some examples the second threshold $T_{th,2}$ may be the same as the first threshold $T_{th,1}$ (e.g., when the system 100-c is configured with a single threshold for memory heating), and activating, deactivating, or otherwise controlling heating of the memory device 110-c may be based on a relationship between the indicated temperature 405 and the single threshold (e.g., whether the indicated temperature 405 is above the threshold or below the threshold).

The indicated temperature 405 may be determined at $t_3$ by one or more components of the system 100-c, and because the indicated temperature 405 is at or above or otherwise satisfies the second threshold $T_{th,2}$, the system 100-c may disable, deactivate, or otherwise adjust heating of the memory device 110-c according to various techniques. Accordingly, following one or more of the operations at $t_3$, the indicated temperature 405 may fall (e.g., when the ambient temperature $T_A$ is below the indicated temperature 405, when heat loss from cooling is greater than heat generation from operating the memory device 110-c), which may or may not follow an overshoot after $t_3$ of the indicated temperature 405 past the second threshold $T_{th,2}$ (e.g., due to heat spreading across components, due to delay between applying heat and temperature rising at a temperature sensor, due to signaling delay or processing delay). The memory device 110-c may remain available for access operations (e.g., read operations, write operations) through $t_3$.

In a first example of $t_3$, the memory device 110-c may determine the indicated temperature 405 (e.g., from one or more memory device temperature sensors 320), and compare or otherwise evaluate the indicated temperature 405 to the second threshold $T_{th,2}$ (e.g., determining that the indicated temperature 405 is at or above or otherwise satisfies the second threshold $T_{th,2}$). Based on the comparison or evaluation, the memory device 110-c may deactivate, disable, or otherwise adjust the circuitry or other components configured to heat the memory device 110-c (e.g., deactivating one or more memory device memory heaters 350, sending a command to deactivate one or more host device memory heaters 360 or one or more coupling component memory heaters 370). In some examples, based on one or more of the operations of $t_3$, the memory device 110-c may indicate (e.g., to the host device 305) that the memory device 110-c is not being heated. In some examples, such indications may be conveyed via initialization signaling 390, mode signaling 395, or some other signaling such as an EDC or JTAG signal or data line.

In a second example of $t_3$, the host device 305 may determine or otherwise receive signaling associated with the indicated temperature 405 (e.g., from one or more host device temperature sensors 330 or coupling component temperature sensors 340, via temperature signaling 385 indicating a temperature of the memory device 110-c), and compare or otherwise evaluate the indicated temperature 405 to the second threshold $T_{th,2}$ (e.g., determining that the indicated temperature 405 is at or above or otherwise satisfies the second threshold $T_{th,2}$). Based on the comparison or other identification or determination of $t_3$, the host device 305 may deactivate, disable, or otherwise adjust or control circuitry or other components configured to heat the memory device 110-c (e.g., deactivating one or more host device memory heaters 360, sending a command to deactivate one or more memory device memory heaters 350 or one or more coupling component memory heaters 370). The host device may continue transmitting or issuing access commands to access the memory device 110-c through $t_3$.

At $t_4$, the indicated temperature 405 may cross a third threshold $T_{th,3}$ (e.g., based on cooling of the memory device 110-c). In some examples, the third threshold $T_{th,3}$ may be a threshold of the memory device 110-c that is different than a lower threshold of an operating temperature range of the memory device 110-c (e.g., different than $T_{th,1}$, greater than $T_{th,1}$), or different than a threshold associated with disabling or deactivating heating of the memory device 110-c (e.g., different than $T_{th,2}$, less than $T_{th,2}$). In some examples, the third threshold $T_{th,3}$ may be 5° C., but other examples may include a third threshold at a different temperature (e.g., a higher or lower temperature then 5° C.). Although the third threshold $T_{th,3}$ is described as being different than the first threshold $T_{th,1}$ and the second threshold $T_{th,2}$, in some examples the third threshold $T_{th,3}$ may be the same as the first threshold $T_{th,1}$, the second threshold $T_{th,2}$, or both (e.g., when the system 100-c is configured with a single threshold for memory heating), and activating, deactivating, or otherwise controlling heating of the memory device 110-c may be based on a relationship between the indicated temperature 405 and the single threshold (e.g., whether the indicated temperature 405 is above the threshold or below the threshold).

The indicated temperature 405 may be determined at $t_4$ by one or more components of the system 100-c, and because the indicated temperature 405 is at or below or otherwise satisfies the third threshold $T_{th,3}$, the system 100-c may again initiate heating of the memory device 110-c according to various techniques. Accordingly, following one or more of the operations at $t_4$, the indicated temperature 405 may rise. The memory device 110-c may remain available for access operations (e.g., read operations, write operations) through $t_4$.

In a first example of $t_4$, the memory device 110-c may determine the indicated temperature 405 (e.g., from one or more memory device temperature sensors 320), and compare or otherwise evaluate the indicated temperature 405 to the third threshold $T_{th,3}$ (e.g., determining that the indicated temperature 405 is at or below or otherwise satisfies the third threshold $T_{th,3}$). Based on the comparison or evaluation, the memory device 110-c may activate, enable, or otherwise control circuitry or other components configured to heat the memory device 110-c (e.g., activating one or more memory device memory heaters 350, sending a command to activate one or more host device memory heaters 360 or one or more coupling component memory heaters 370). In some examples, based on one or more of the operations of $t_4$, the memory device 110-c may indicate (e.g., to the host device 305) that the memory device 110-c is being heated. In some examples, such indications may be conveyed via initialization signaling 390, mode signaling 395, or some other signaling such as an EDC or JTAG signal or data line.

In a second example of $t_4$, the host device 305 may determine or otherwise receive signaling associated with the indicated temperature 405 (e.g., from one or more host device temperature sensors 330 or coupling component temperature sensors 340, via temperature signaling 385 indicating a temperature of the memory device 110-c), and compare or otherwise evaluate the indicated temperature 405 to the third threshold $T_{th,3}$ (e.g., determining that the indicated temperature 405 is at or below or otherwise satisfies the first threshold $T_{th,3}$). In other examples, the host device 305 may otherwise identify or determine that the temperature of the memory device 110-c is at or below or otherwise satisfies the third threshold $T_{th,3}$ (e.g., via initialization signaling 390 or mode signaling 395 indicating that a temperature of the memory device 110-c is at or below or otherwise satisfies a threshold). Based on the comparison or other identification or determination of $t_4$, the host device 305 may activate, enable, or otherwise control circuitry or other components configured to heat the memory device 110-c (e.g., activating one or more host device memory heaters 360, sending a command to activate one or more memory device memory heaters 350 or one or more coupling component memory heaters 370). The host device may continue transmitting or issuing access commands to access the memory device 110-c through $t_4$.

At $t_5$, the indicated temperature 405 may again cross the second threshold $T_{th,2}$ (e.g., based on heating or operation of the memory device 110-c). The indicated temperature 405 may be determined at $t_5$ by one or more components of the system 100-c, and because the indicated temperature 405 is at or above or otherwise satisfies the second threshold $T_{th,2}$, the system 100-c may disable, deactivate, or otherwise adjust heating of the memory device 110-c according to various techniques (e.g., similar to techniques described with reference to the indicated temperature 405 crossing the second threshold $T_{th,2}$ at $t_3$). Accordingly, following one or more of the operations at $t_5$, the indicated temperature 405 may again fall (e.g., when the ambient temperature $T_A$ is below the indicated temperature 405, when heat loss from cooling is greater than heat generation from operating the memory device 110-c), which may or may not follow an overshoot after $t_5$ of the indicated temperature 405 past the second threshold $T_{th,2}$ (e.g., due to heat spreading across components, due to delay between applying heat and temperature rising at a temperature sensor, due to signaling delay or processing delay). The memory device 110-c may remain available for access operations (e.g., read operations, write operations) through $t_5$, and the system 100-c may proceed with various operations including the described techniques for controlled memory heating.

In various examples of the techniques described with reference FIGS. 3 through 5, any one or more of the described thresholds (e.g., the first threshold $T_{th,1}$, the second threshold $T_{th,2}$, the third threshold $T_{th,3}$, the fourth threshold $T_{th,4}$) may be configured, identified, or determined according to various techniques. For example, any one or more of the thresholds may be configured at a device (e.g., as a static value or level or a set of static values or levels at a memory device 110-c, as a static value or level or set of static values or levels at a host device 305), which may be stored in a mode register, trim parameters, or one or more non-volatile storage elements (e.g., fuses, antifuses) of the respective device that are configured to store an indication of one or more configurations or thresholds of the respective device. In various examples, the memory device 110-c or the host device 305 may identify a configuration (e.g., a configured threshold) by accessing such non-volatile storage elements.

Additionally or alternatively, any one or more of the thresholds may be determined or identified at a device based at least in part on a mode of operation of the device (e.g., a refresh mode, an access mode, a read/write mode, an idle mode, an active mode), or of a different device (e.g., based on signaling of the mode of operation of the other device, such as mode signaling 395). In some examples, any one or more of the thresholds may be determined or identified at a device based at least in part on operating conditions of the device. For example, when the indicated temperature 405 experiences rapid fluctuations (e.g., when the ambient temperature $T_A$ of the environment 302 is particularly low), the second threshold $T_{th,2}$ may be set relatively higher (e.g., a wider hysteresis band), or the third threshold $T_{th,3}$ may be set relatively higher (e.g., to limit overshoot of the indicated temperature 405 outside of the operational temperature range of the memory device 110-c), or both.

The described comparisons or evaluations of the indicated temperatures (e.g., indicated temperatures 405 or 505) with various thresholds may be performed by one or both of the memory device 110-c or the host device 305 according to various techniques, which may include operations performed at a device memory controller 155 or an external memory controller 105. For example, when an indicated temperature is represented in the digital domain at the memory device 110-c or the host device 305, such comparisons may be performed in the digital domain at a processor or digital comparator (e.g., as a comparison of binary values, as a comparison of integer values, as a comparison of floating point values). When an indicated temperature is represented in the analog domain at the memory device 110-c or the host device 305 (e.g., as a voltage of a thermocouple, as a voltage or current across an RTD), such comparisons may be performed in the analog domain at a processor, a comparator, a transistor (e.g., between a gate and source or drain node), or other circuitry (e.g., as a comparison of a voltage against a reference voltage indicative of a threshold, as a comparison of a current against a reference current indicative of a threshold).

Figure 5:
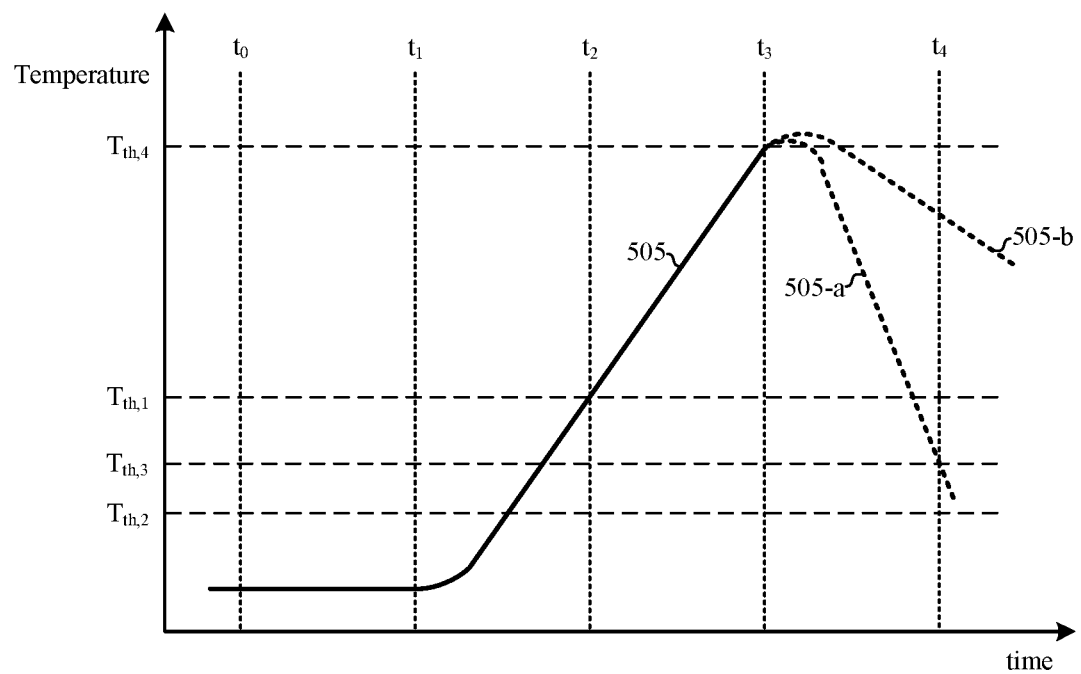
FIG. 5 illustrates an example of a temperature profile associated with controlled and mode-dependent heating of a memory device, in accordance with aspects disclosed herein.

Moreover, although the operations described with reference to FIGS. 3 through 5 are described as including activating and deactivating circuitry configured to heat the memory device 110-c, more complex forms of control may be applied. For example, a degree of heating (e.g., an amount of heat flux) may be controlled, adjusted, or otherwise modulated by various control techniques, such as proportional-integral-derivative (PID) control, pulse width modulation (PWM), and other techniques. In some examples, temperature thresholds or levels may be applied to such control techniques as target temperatures, deadbands, gain scheduling, and other techniques.

FIG. 5 illustrates an example of a temperature profile 500 associated with controlled and mode-dependent heating of a memory device 110, in accordance with aspects disclosed herein. The temperature profile 500 may illustrate an example of an indicated temperature 505 of the memory device 110-c when performing mode-dependent heating in the system 100-c described with reference to FIG. 3. In various examples, the indicated temperature 505 may be illustrative of a temperature indicated at the memory device 110-c (e.g., $T_1$, as indicated by one or more memory device temperature sensors 320), a temperature indicated at the host device 305 (e.g., $T_2$, as indicated by one or more host device temperature sensors 330), a temperature indicated at the coupling component 310 (e.g., $T_3$, as indicated by one or more coupling component temperature sensors 340), or some combination thereof. In some examples, the indicated temperature 505 may be illustrative of an average indicated temperature of a set of temperature sensors, a minimum indicated temperature of a set of temperature sensors, a maximum indicated temperature of a set of sensors, or some other combination or operation applied to a set of temperature sensors.

At $t_0$, the memory device 110-c may be operating in a first mode of the memory device 110-c. In various examples, the first mode may be a refresh mode, a self-refresh mode, a standby mode, a memory device idle mode, a host device idle mode, or another mode in which data is not being exchanged between the memory device 110-c and another component in the system (e.g., not exchanging data with the host device 305). Accordingly, at $t_0$, the memory device 110-c may be operating in a mode associated with refreshing one or more memory cells 205 of the memory device 110-c (e.g., based at least in part on the memory device 110-c operating in the first mode of the memory device 110-c).

In some examples, a power source of the memory device 110-c may be determined (e.g., by the memory device 110-c, by the host device 305, via mode signaling 395), and operating the memory device 110-c in the first mode (e.g., operations of the memory device 110-c, commands of the host device 305) may be based at least in part on the determined power source. For example, in a vehicle application, operating in the first mode may be based on a determination (e.g., by the host device 305, by the memory device 110-c) that the memory device 110-c is operating on battery power, rather than an alternator or generator. In some examples, the memory device 110-c may be receiving power, but the memory device 110-c may be unavailable for read operations or write operations (e.g., due to restrictions or other operating conditions associated with the first mode of the memory device 110-c).

In some examples, operating in the first mode of the memory device 110-c may be based on a comparison of the indicated temperature 505 to a threshold (e.g., a third threshold, $T_{th,3}$), which may be a comparison or evaluation performed by either one or both of the memory device 110-c or the host device 305. In other words, first mode of the memory device 110-c may be triggered based on the indicated temperature 505 being at or below the third threshold $T_{th,3}$, or various operations associated with the first mode of the memory device 110-c may be based at least in part on the indicated temperature 505 being at or below the third threshold $T_{th,3}$. Accordingly, the first mode may be a low-temperature refresh mode or a low-temperature self-refresh mode of the memory device 110-c.

In a first example of $t_0$, the memory device 110-c may determine the indicated temperature 505 (e.g., from one or more memory device temperature sensors 320), and compare or otherwise evaluate the indicated temperature 505 to the third threshold $T_{th,3}$ (e.g., determining that the indicated temperature 505 is at or below or otherwise satisfies the third threshold $T_{th,3}$). Based at least in part on the comparison or evaluation, the memory device 110-c may operate or determine to operate in the first mode of the memory device 110-c. In some examples, the memory device 110-c may indicate (e.g., to the host device 305) a restriction of access operations for the memory device 110-c (e.g., that the memory device 110-c is unavailable for read or write commands, that read or write operations are disabled for the memory device 110-c) while operating in the first mode. In some examples, such indications may be conveyed via mode signaling 395, or some other signaling such as an EDC or JTAG signal or data line.

In a second example of $t_0$, the host device 305 may determine or otherwise receive signaling associated with the indicated temperature 505 (e.g., from one or more host device temperature sensors 330 or coupling component temperature sensors 340, via temperature signaling 385 indicating a temperature of the memory device 110-c), and compare or otherwise evaluate the indicated temperature 405 to the third threshold $T_{th,3}$ (e.g., determining that the indicated temperature 505 is at or below or otherwise satisfies the third threshold $T_{th,3}$). In other examples, the host device 305 may otherwise identify or determine that the temperature of the memory device 110-c is at or below or otherwise satisfies the third threshold $T_{th,3}$ (e.g., via mode signaling 395 indicating that a temperature of the memory device 110-c is associated with the first mode of the memory device 110-c).

Based on the comparison or other identification or determination of $t_0$ (e.g., a determination by the host device 305 that the indicated temperature 505 is associated with the first mode), the host device 305 may operate the memory device 110-c according to the first mode, which in some examples may include suppressing access operations (e.g., read operations, write operations) by the host device 305. In some examples, the host device 305 may otherwise understand that the memory device 110-c is operating in the first mode (e.g., via mode signaling 395 associated with the first mode), and the host device may suppress access operations (e.g., read operations, write operations) with the memory device 110-c based on the understanding. In other examples, the host device 305 may not have reason to be performing or to request performing access operations at $t_0$, which may support the operation of the host device 305 in a host device idle mode, for example. In some examples, the memory device 110-c may operate in the first mode based on a command from the host device 305 (e.g., via mode signaling 395), which may be based on the comparison or other identification or determination of $t_0$.

At $t_1$, there may be a desire to transition to a second mode of the memory device 110-c. For example, the host device 305 may have information to be written to the memory device 110-c, or may wish to retrieve data from the memory device 110-c, or the system 100-c may have some other condition associated with a transition to the second mode (e.g., an enabling or activating of a portion of the system 100-c, a change in power source associated with the system 100-c, an ignition trigger of a vehicle). In some examples, the second mode of the memory device 110-c may be associated with particular access operations, such as a mode associated with read operations or write operations (e.g., a read mode, a write mode, a read/write mode, a mode associated with information exchange at the memory device 110-c). In some examples, the second mode of the memory device 110-c may be associated with a different (e.g., higher) temperature or temperature range than the first mode of the memory device 110-c (e.g., an operating temperature range that is higher than the temperature of $t_1$). Accordingly, to support a transition to the second mode of the memory device 110-c, circuitry configured to heat the memory device 110-c may be activated at $t_1$.

In a first example of $t_1$, the host device 305 may transmit, to the memory device 110-c, signaling associated with the second mode of the memory device 110-c. Such signaling may include an indication (e.g., for the memory device 110-c) to switch to the second mode of the memory device 110-c, or a command to access the memory device 110-c (e.g., an access command, a read command, a write command). Accordingly, the memory device 110-c may receive the signaling associated with the second mode, and in response, the memory device 110-c may activate, enable, or otherwise control circuitry or other components configured to heat the memory device 110-c (e.g., activating one or more memory device memory heaters 350, sending a command to activate one or more host device memory heaters 360 or one or more coupling component memory heaters 370). Thus, after $t_1$, the indicated temperature 505 may rise (e.g., based on the memory device 110-c activating circuitry or other components configured to heat the memory device 110-c).

In some examples, based on one or more of the operations of $t_1$ (e.g., based on receiving the signaling associated with the second mode) the memory device 110-c may indicate (e.g., to the host device 305) that the memory device 110-c is being heated, or indicate a restriction of access operations for the memory device 110-c (e.g., that the memory device 110-c is unavailable for read or write commands, that read or write operations are disabled for the memory device 110-c). In some examples, such indications may be conveyed via initialization signaling 390, mode signaling 395, or some other signaling such as an EDC or JTAG signal or data line.

In some examples, the memory device 110-c may determine the indicated temperature 505 (e.g., from one or more memory device temperature sensors 320), and compare or otherwise evaluate the indicated temperature 405 to a second threshold $T_{th,2}$ (e.g., determining that the indicated temperature 505 is at or below or otherwise satisfies the second threshold $T_{th,2}$). In some examples, the activating, enabling, or controlling the circuitry or other components configured to heat the memory device 110-c may be based at least in part on the comparison or evaluation. Although the second threshold $T_{th,2}$ and the third threshold $T_{th,3}$ illustrated as having different values, in some examples the second threshold $T_{th,2}$ and the third threshold $T_{th,3}$ may have the same value (e.g., a same threshold used to operate in the first mode, and for activating memory heating when receiving signaling associated with the second mode).

In a second example of $t_1$, the host device 305 may determine or otherwise receive signaling associated with the indicated temperature 505 (e.g., from one or more host device temperature sensors 330 or coupling component temperature sensors 340, via temperature signaling 385 indicating a temperature of the memory device 110-c), and compare or otherwise evaluate the indicated temperature 505 to the second threshold $T_{th,2}$ (e.g., determining that the indicated temperature 505 is at or below or otherwise satisfies the second threshold $T_{th,2}$). In other examples, the host device 305 may otherwise identify or determine that the memory device 110-c is in the first mode (e.g., via mode signaling 395), and accordingly that the memory device 110-c is at a temperature associated with the first mode (e.g., a temperature lower than a temperature or temperature range associated with the second mode).

Based on the comparison or other identification or determination of $t_1$, the host device 305 may activate, enable, or otherwise control circuitry or other components configured to heat the memory device 110-c (e.g., activating one or more host device memory heaters 360, sending a command to activate one or more memory device memory heaters 350 or one or more coupling component memory heaters 370). In examples where the system 100-c includes multiple memory devices 110, the host device may activate circuitry configured to heat all of the memory devices 110, or activate circuitry configured to heat a subset of the memory devices 110, with such a subset selected based on operating conditions, types of memory devices 110, types of data to be exchanged with memory devices 110, types of access operations, and other considerations. Accordingly, after $t_1$, the indicated temperature 505 may rise (e.g., based on the host device 305 activating circuitry or other components configured to heat the memory device 110-c).

At $t_2$, the indicated temperature 505 may cross the first threshold $T_{th,1}$ (e.g., based on heating or operation of the memory device 110-c). In some examples, the first threshold Tao may be a lower threshold temperature associated with the second mode of the memory device 110-c, or a lower temperature of an operating range of the memory device 110-c. The indicated temperature 505 may be determined at $t_2$ by one or more components of the system 100-c, and because the indicated temperature 505 is at or above or otherwise satisfies the first threshold $T_{th,1}$, operation of the memory device 110-c may transition to the second mode. In other words, the memory device 110-c may operate in the second mode based at least in part on activating circuitry or other components configured to heat the memory device.

In some examples at $t_2$ (e.g., based on the transition to the second mode), the memory device 110-c may become available for access operations (e.g., read operations, write operations). Accordingly, at $t_2$, the memory device 110-c may be operating in a mode associated with accessing one or more memory cells 205 of the memory device 110-c (e.g., based at least in part on the memory device 110-c operating in the first mode of the memory device 110-c). In some examples, based on the operations of $t_2$, the memory device 110-c may exchange information with the host device (e.g., via data signaling 380), and the accessing may be based at least in part on information exchanged with the host device. In some examples, operating the memory device 110-c in the second mode may be associated with a higher power consumption than operating the memory device 110-c in the first mode (e.g., where access operations such as read operations and write operations are associated with a higher power than refresh or self-refresh operations). Although the indicated temperature of the memory device 110-c may be at or above or otherwise satisfies the first threshold $T_{th,1}$, the heating of the memory device 110-c may continue through $t_2$ (e.g., when a different threshold is used to disable, deactivate, or otherwise control memory heating).

In a first example of $t_2$, the memory device 110-c may determine the indicated temperature 505 (e.g., from one or more memory device temperature sensors 320), and compare or otherwise evaluate the indicated temperature 405 to the first threshold $T_{th,1}$ (e.g., determining that the indicated temperature 505 is at or above or otherwise satisfies the first threshold $T_{th,1}$). Based on the comparison or evaluation of $t_2$, the memory device 110-c may transition to operating in the second mode (e.g., ceasing a restriction of access operations, transitioning from a refresh mode to an access mode), which may be accompanied by the memory device 110-c signaling (e.g., to the host device 305, via mode signaling 395 or some other signaling such as an EDC or JTAG signal or data line) that the memory device 110-c is operating in the second mode or that the memory device 110-c is available for access operations (e.g., via a "ready-to-operate" signal).

In a second example of $t_2$, the host device 305 may determine or otherwise receive signaling associated with the indicated temperature 505 (e.g., from one or more host device temperature sensors 330 or coupling component temperature sensors 340, via temperature signaling 385 indicating a temperature of the memory device 110-c), and compare or otherwise evaluate the indicated temperature 505 to the first threshold $T_{th,1}$ (e.g., determining that the indicated temperature 505 is at or above or otherwise satisfies the first threshold $T_{th,1}$). In other examples, the host device 305 may otherwise identify or determine that the temperature of the memory device 110-c is at or above or otherwise satisfies the first threshold $T_{th,1}$ (e.g., via mode signaling 395 indicating that a temperature of the memory device 110-c is at or above or otherwise satisfies a threshold). Based on the comparison or other identification or determination of $t_2$ (e.g., based on an indication that the memory device is available for access operations, based on receiving a "ready-to-operate" signal), the host device 305 may transition to operating the memory device 110-c in the second mode of the memory device 110-c, which may include proceeding with issuing or transmitting commands (e.g., via data signaling 380) to access the memory device 110-c, or otherwise performing an access operation associated with the memory device 110-c being in the second mode.

At $t_3$, the indicated temperature 505 may cross a fourth threshold $T_{th,4}$ (e.g., based on heating or operation of the memory device 110-c). In some examples, the fourth threshold $T_{th,4}$ may be a threshold of the memory device 110-c that is different than a lower threshold of an operating temperature range of the memory device 110-c, different than a threshold associated with activating heating of the memory device 110-c (e.g., different than $T_{th,2}$, greater than $T_{th,2}$), or different than a threshold associated with a transition to the second mode (e.g., different than $T_{th,1}$, greater than $T_{th,1}$). In some examples, the second threshold $T_{th,2}$ may be 10° C., but other examples may include a second threshold at a different temperature (e.g., a higher or lower temperature then 10° C.).

In some examples, the fourth threshold $T_{th,4}$ may be configured, set, or selected to reduce the rate or duty cycle of memory heating being enabled and disabled (e.g., when the fourth threshold $T_{th,4}$ is different than the second threshold $T_{th,2}$). Accordingly, the different fourth threshold $T_{th,4}$ and the second threshold $T_{th,2}$, or the band between the fourth threshold $T_{th,4}$ and the second threshold $T_{th,2}$, may be referred to as a temperature hysteresis range or hysteresis band associated with heating the memory device 110-c. Although the fourth threshold $T_{th,4}$ is described as being different than the second threshold $T_{th,2}$, in some examples the fourth threshold $T_{th,4}$ may be the same as the second threshold $T_{th,2}$ (e.g., when the system 100-c is configured with a single threshold for memory heating), and activating, deactivating, or otherwise controlling heating of the memory device 110-c may be based on a relationship between the indicated temperature 505 and the single threshold (e.g., whether the indicated temperature 505 is above the threshold or below the threshold). Further, although the fourth threshold $T_{th,4}$ is described as being different than the first threshold $T_{th,1}$, in some examples the fourth threshold $T_{th,4}$ may be the same as the first threshold $T_{th,1}$ (e.g., when the system 100-c is configured with a threshold shared for memory heating and mode switching), and activating, deactivating, or otherwise controlling heating of the memory device 110-c may be based on whether the memory device 110-c is operating in the first mode or the second mode, or whether a transition from the first mode to the second mode has completed.

The indicated temperature 505 may be determined at $t_3$ by one or more components of the system 100-c, and because the indicated temperature 405 is at or above or otherwise satisfies the fourth threshold $T_{th,4}$, the system 100-c may disable, deactivate, or otherwise adjust heating of the memory device 110-c according to various techniques. Accordingly, following one or more of the operations at $t_3$, the indicated temperature 505 may fall (e.g., when the ambient temperature $T_A$ is below the indicated temperature 505, when heat loss from cooling is greater than heat generation from operating the memory device 110-c), which may or may not follow an overshoot after $t_3$ of the indicated temperature 505 past the fourth threshold $T_{th,4}$ (e.g., due to heat spreading across components, due to delay between applying heat and temperature rising at a temperature sensor, due to signaling delay or processing delay). The memory device 110-c may remain available for access operations (e.g., read operations, write operations) through $t_3$.

In a first example of $t_3$, the memory device 110-c may determine the indicated temperature 505 (e.g., from one or more memory device temperature sensors 320), and compare or otherwise evaluate the indicated temperature 505 to the fourth threshold $T_{th,4}$ (e.g., determining that the indicated temperature 505 is at or above or otherwise satisfies the fourth threshold $T_{th,4}$). Based on the comparison or evaluation, the memory device 110-c may deactivate, disable, or otherwise adjust the circuitry or other components configured to heat the memory device 110-c (e.g., deactivating one or more memory device memory heaters 350, sending a command to deactivate one or more host device memory heaters 360 or one or more coupling component memory heaters 370). In some examples, based on one or more of the operations of $t_3$, the memory device 110-c may indicate (e.g., to the host device 305) that the memory device 110-c is not being heated. In some examples, such indications may be conveyed via initialization signaling 390, mode signaling 395, or some other signaling such as an EDC or JTAG signal or data line.

In a second example of $t_3$, the host device 305 may determine or otherwise receive signaling associated with the indicated temperature 505 (e.g., from one or more host device temperature sensors 330 or coupling component temperature sensors 340, via temperature signaling 385 indicating a temperature of the memory device 110-c), and compare or otherwise evaluate the indicated temperature 505 to the fourth threshold $T_{th,4}$ (e.g., determining that the indicated temperature 505 is at or above or otherwise satisfies the fourth threshold $T_{th,4}$). Based on the comparison or other identification or determination of $t_3$, the host device 305 may deactivate, disable, or otherwise adjust or control circuitry or other components configured to heat the memory device 110-c (e.g., deactivating one or more host device memory heaters 360, sending a command to deactivate one or more memory device memory heaters 350 or one or more coupling component memory heaters 370). The host device may continue transmitting or issuing access commands to access the memory device 110-c through $t_3$.

At $t_4$, the operating the memory device 110-c may transition from operating in the second mode of the memory device 110-c, which may include transitioning to the first mode of the memory device 110-c, a modification of the first mode of the memory device 110-c, or some other mode of the memory device 110-c that is different than the second mode. In some examples, the transition from the second mode may be based on a lack of access operations associated with data exchange between the host device 305 and the memory device 110-c (e.g., a lack or absence of data signaling 380). In some examples, the transition of $t_4$ may be associated with a transition to a refresh mode, a self-refresh mode, a standby mode, a memory device idle mode, or a host device idle mode, which may be a same mode or a different mode than at $t_0$.

In a first example of $t_4$, the memory device 110-c may identify a lack of data to be exchanged with the host device 305 (e.g., a lack of data signaling 395), a completion of access operations with the host device 305, or some other determination to change a mode of the memory device 110-c. In some examples, the memory device 110-c may compare or otherwise evaluate the indicated temperature 505 to a threshold as part of a determination to change mode of the memory device 110-c. Thus, according to various examples, a determination to change mode at $t_4$ may be performed at the memory device 110-c.

In some examples, a transition may be based at least in part on a comparison of the indicated temperature 505 with the third threshold $T_{th,3}$. According to indicated temperature 505-a, for example, a transition to operating in the first mode of the memory device 110-c may occur directly after determining that access operations are completed with the host device 305 because the indicated temperature 505-a is at or below the third threshold $T_{th,3}$ (e.g., when the first mode or the third threshold $T_{th,3}$ is associated with a low-temperature refresh or self-refresh mode). According to indicated temperature 505-b, for example, a transition to operating in the first mode of the memory device 110-c may occur directly after determining a completion of access operations with the host device 305, even when the indicated temperature 505-b is above the third threshold $T_{th,3}$ (e.g., when the first mode is a refresh mode or self-refresh mode that is not associated with low-temperature operations, or when the temperature of indicated temperature 505-b falls in a range that is still associated with a low-temperature refresh or self-refresh mode, or when the first mode generally refers to a refresh or self refresh mode).

In another example, a transition to operating in the first mode of the memory device 110-c may not occur directly after determining that access operations are completed the host device 305, but may occur after falling to or below the third threshold $T_{th,3}$, which may include an intermediate mode before the indicated temperature 505 falls to or below the third threshold $T_{th,3}$. In some examples, determinations of whether access operations are being performed with host device 305 may be made by the memory device 110-c after a comparison or other evaluation of the indicated temperature 505 to a threshold. In some examples example, the memory device 110-c may determine an elapsed time since an access operation, and switching from operating in the second mode of the memory device 110-c to operating in the first mode of the memory device 110-c may be based at least in part on the elapsed time, which may or may not be based on the indicated temperature 505.

In a second example of $t_4$, the host device 305 may identify a lack of data to be exchanged with the memory device 110-c, a completion of access operations with the memory device 110-c, or some other determination to change a mode of the memory device 110-c. In some examples, the host device 305 may compare or otherwise evaluate the indicated temperature 505 to a threshold as part of a determination to change operations according to a mode of the memory device 110-c. Thus, according to various examples, a determination to change mode at $t_4$ may be performed at the host device 305.

In some examples, the host device 305 may transmit an indication to the memory device 110-c to switch from the second mode of the memory device 110-c (e.g., via mode signaling 395). In some examples, the indication may be an explicit indication for the memory device 110-c to transition to the first mode. In some examples, the indication may be an indication to the memory device 110-c otherwise associated with the first mode that the memory device 110-c may use to determine whether to transition to the first mode (e.g., in combination with an evaluation of the indicated temperature 505 with a threshold by the memory device 110-c, such as whether following the indicated temperature 505-a or 505-b).

In one example, the memory device 110-c may determine to transition to the first mode based on signaling from the host device 305 that is associated with entering the first mode or exiting the second mode, and a comparison of the indicated temperature 505 with the third threshold $T_{th,3}$. According to indicated temperature 505-a, a transition to operating in the first mode of the memory device 110-c may occur directly after receiving an indication from the host device 305, because the indicated temperature 505-a is at or below the third threshold $T_{th,3}$ (e.g., when the first mode or the third threshold $T_{th,3}$ is associated with a low-temperature refresh or self-refresh mode). According to indicated temperature 505-b, a transition to operating in the first mode of the memory device 110-c may occur directly after receiving an indication from the host device 305, even when the indicated temperature 505-b is above the third threshold $T_{th,3}$ (e.g., when the first mode is a refresh mode or self-refresh mode that is not associated with low-temperature operations, or when the temperature of indicated temperature 505-b falls in a range that is still associated with a low-temperature refresh or self-refresh mode, or when the first mode generally refers to a refresh or self refresh mode). In another example, a transition to operating in the first mode of the memory device 110-c may not occur directly after receiving an indication from the host device 305, but may occur after falling to or below the third threshold $T_{th,3}$, which may include an intermediate mode before the indicated temperature 505 falls to or below the third threshold $T_{th,3}$).

Operations with the memory device 110-c may continue according to the first mode of the memory device 110-c, the second mode of the memory device 110-c, or other modes of the memory device 110-c, in accordance with various techniques described herein. Under various conditions (e.g., according to different modes), the memory device 110-c may or may not be available for various access operations with the host device 305 at a given time, but the system 100-c may include activate circuitry or other components configured to heat the memory device 110-c to support various operational modes. Accordingly, the mode-dependent heating of the memory device 110-c described with reference to FIG. 5 may illustrate examples of aligning memory temperature to access type.

In various examples of the techniques described with reference FIGS. 3 through 5, any one or more of the described thresholds (e.g., the first threshold $T_{th,1}$, the second threshold $T_{th,2}$, the third threshold $T_{th,3}$, the fourth threshold $T_{th,4}$) may be configured, identified, or determined according to various techniques. For example, any one or more of the thresholds may be configured at a device (e.g., as a static value or level or a set of static values or levels at a memory device 110-c, as a static value or level or set of static values or levels at a host device 305), which may be stored in a mode register, trim parameters, or one or more non-volatile storage elements (e.g., fuses, antifuses) of the respective device that are configured to store an indication of one or more configurations or thresholds of the respective device. In various examples, the memory device 110-c or the host device 305 may identify a configuration (e.g., a configured threshold) by accessing such non-volatile storage elements.

Additionally or alternatively, any one or more of the thresholds may be determined or identified at a device based at least in part on a mode of operation of the device (e.g., a refresh mode, an access mode, a read/write mode, an idle mode, an active mode), or of a different device (e.g., based on signaling of the mode of operation of the other device, such as mode signaling 395). In some examples, any one or more of the thresholds may be determined or identified at a device based at least in part on operating conditions of the device. For example, when the indicated temperature 405 experiences rapid fluctuations (e.g., when the ambient temperature $T_A$ of the environment 302 is particularly low), the second threshold $T_{th,2}$ may be set relatively higher (e.g., a wider hysteresis band), or the third threshold $T_{th,3}$ may be set relatively higher (e.g., to limit overshoot of the indicated temperature 405 outside of the operational temperature range of the memory device 110-c), or both.

The described comparisons or evaluations of the indicated temperatures (e.g., indicated temperatures 405 or 505) with various thresholds may be performed by one or both of the memory device 110-c or the host device 305 according to various techniques, which may include operations performed at a device memory controller 155, local memory controller 165, or an external memory controller 105. For example, when an indicated temperature is represented in the digital domain at the memory device 110-c or the host device 305, such comparisons may be performed in the digital domain at a processor or digital comparator (e.g., as a comparison of binary values, as a comparison of integer values, as a comparison of floating point values). When an indicated temperature is represented in the analog domain at the memory device 110-c or the host device 305 (e.g., as a voltage of a thermocouple, as a voltage or current across an RTD), such comparisons may be performed in the analog domain at a processor, a comparator, a transistor (e.g., between a gate and source or drain node), or other circuitry (e.g., as a comparison of a voltage against a reference voltage indicative of a threshold, as a comparison of a current against a reference current indicative of a threshold).

Moreover, although the operations described with reference to FIGS. 3 through 5 are described as including activating and deactivating circuitry configured to heat the memory device 110-c, more complex forms of control may be applied. For example, a degree of heating (e.g., an amount of heat flux) may be controlled, adjusted, or otherwise modulated by various control techniques, such as proportional-integral-derivative (PID) control, pulse width modulation (PWM), and other techniques. In some examples, temperature thresholds or levels may be applied to such control techniques as target temperatures, deadbands, gain scheduling, and other techniques.

Figure 6A:
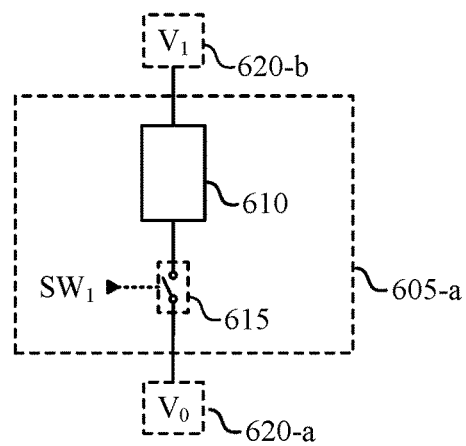
FIGS. 6A and 6B illustrate examples of memory heaters that support controlled and mode-dependent heating of a memory device, in accordance with aspects disclosed herein.

FIG. 6A illustrates an example 600-a of a memory heater 605-a that supports controlled and mode-dependent heating of a memory device 110, in accordance with aspects disclosed herein. In various examples of a system 100, the memory heater 605-a may be illustrative of any of a memory device memory heater 350, a host device memory heater 360, or a coupling component memory heater 370.

The memory heater 605-a may include a heating resistor 610 (e.g., a resistive component that may be configured to heat a memory device 110), which may represent any component or circuitry that presents an electrical resistance, and accordingly may convert electrical energy into thermal energy (e.g., heat). In various examples, the heating resistor 610 may be a dedicated component for providing heating, or may be otherwise controllable circuitry that is integrated into an associated component (e.g., a memory device 110, an external memory controller 105, or a coupling component 310). In examples where the memory heater 605-a is part of a memory device 110, the heating resistor 610 may be a component of a memory die 160, which may include a component of a local memory controller 165, a memory array 170, or some other component (e.g., integrated into the memory die 160, coupled with the memory die 160). The memory heater 605-a may also include a switching component 615, which may be a component configured to selectively activate or deactivate the memory heater 605-a (e.g., based on an input signal $SW_1$). The switching component 615 may be an n-type or p-type transistor, and the input signal $SW_1$ may be applied to the gate of the transistor. In various examples, the input signal $SW_1$ may be a logical value (e.g., a digital signal) generated by a memory controller, or may be an analog signal provided from a temperature sensor (e.g., a voltage provided directly from a temperature sensor, or a voltage or other signal from a temperature sensor that has been otherwise amplified or converted).

In some examples, the memory heater 605-a may be coupled with or between a first voltage source 620-a and a second voltage source 620-b. In some examples, the first voltage source 620-a may represent a ground voltage source or chassis ground voltage source, and the second voltage source 620-b may represent some other voltage (e.g., a relatively higher voltage supply or rail). More generally, the voltage $V_0$ of the first voltage source 620-a may be any voltage that is different than the voltage $V_1$ of the second voltage source 620-b. Activating the switching component 615 may permit current flowing through the heating resistor 610 between the first voltage source 620-a and the second voltage source 620-b. Thus, activating the switching component may enable heat generation by the memory heater 605-a (e.g., via ohmic heating of the heating resistor 610). Deactivating the switching component 615 may prevent current from flowing through the heating resistor 610 between the first voltage source 620-a and the second voltage source 620-b. Thus, deactivating the switching component may disable heat generation of the memory heater 605-a.

Figure 6B:
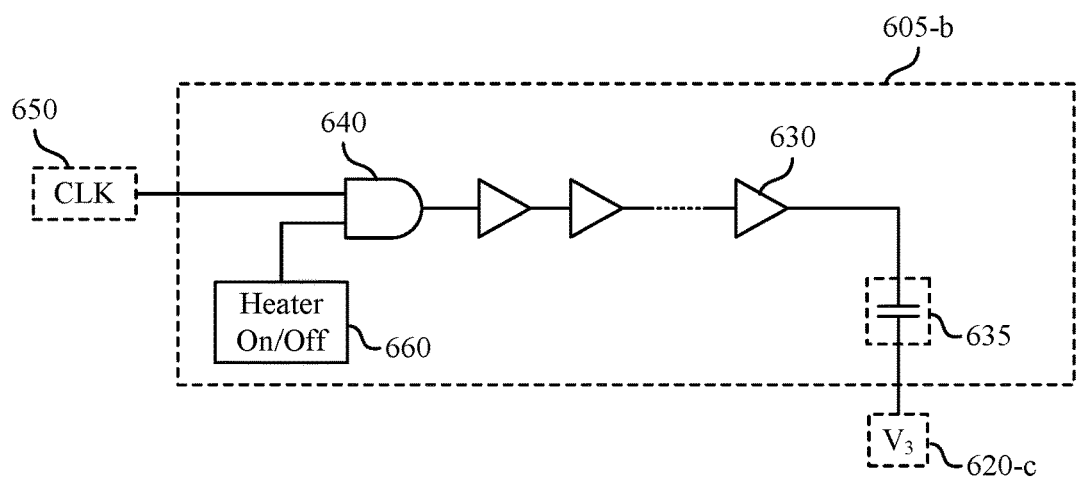

FIG. 6B illustrates an example 600-b of a memory heater 605-b that supports controlled and mode-dependent heating of a memory device 110, in accordance with aspects disclosed herein. In various examples of a system 100, the memory heater 605-b may be illustrative of any of a memory device memory heater 350, a host device memory heater 360, or a coupling component memory heater 370.

The memory heater 605-b may include one or more driver stages 630 (e.g., driver components), which may be coupled with a capacitive load (e.g., a capacitor 635, an oscillator, a resonator). In some examples, an output of a driver stage 630 may be coupled with a first terminal or plate of the capacitor 635 and a voltage source 620-c (e.g., a ground or chassis ground voltage source) may be coupled with a second terminal or plate of the capacitor 635. An input of a driver stage 630 may be coupled with an AND gate 640. In various examples, the memory heater 605-b may include a single driver stage 630, or any number of driver stages 630 (e.g., illustrated in a series arrangement in the example of memory heater 605-b).

The AND gate 640 may represent circuitry configured to provide an output signal (e.g., an output signal that may be applied to one or more driver components) when each of a number of input signals are a relatively high state or voltage, or otherwise enabled state or voltage. In the example of memory heater 605-b, the inputs to the AND gate 640 may include a clock signal 650 and a Heater On/Off signal 660. The clock signal 650 may represent any clock signal, which may be a source of the same component that includes the memory heater 605-b, or a source of a different component (e.g., as conveyed by a clock channel 188). Accordingly, the AND gate 640 may receive, as one input, an oscillating signal that oscillates between a relatively high value and a relatively low value. The AND gate 640 may also receive, as another input, a signal that is enabled (e.g., a relatively high state or voltage) when the memory heater 605-b is activated or otherwise configured for generating heat, or disabled (e.g., a relatively low state or voltage) when the memory heater 605 is deactivated or otherwise not configured for generating heat.

When the Heater On/Off signal is enabled, the AND gate 640 may output an oscillating signal to the one or more driver stages 630, which may support current flowing in and out of the driver stages 630 and the capacitor 635. As a result, heat may be generated by ohmic heating within the driver stages 630, within the capacitor 635, or along conductors or other signal paths between such components, the AND gate 640, and the voltage source 620. When the Heater On/Off signal is disabled, the AND gate 640 may not output any signal, thereby disabling the heating by the memory heater 605-b. In various examples, the Heater On/Off signal 660 may be a logical value (e.g., a digital signal) generated by a memory controller, or may be an analog signal provided from a temperature sensor (e.g., a voltage provided directly from a temperature sensor, or otherwise amplified or converted).

Figure 7:
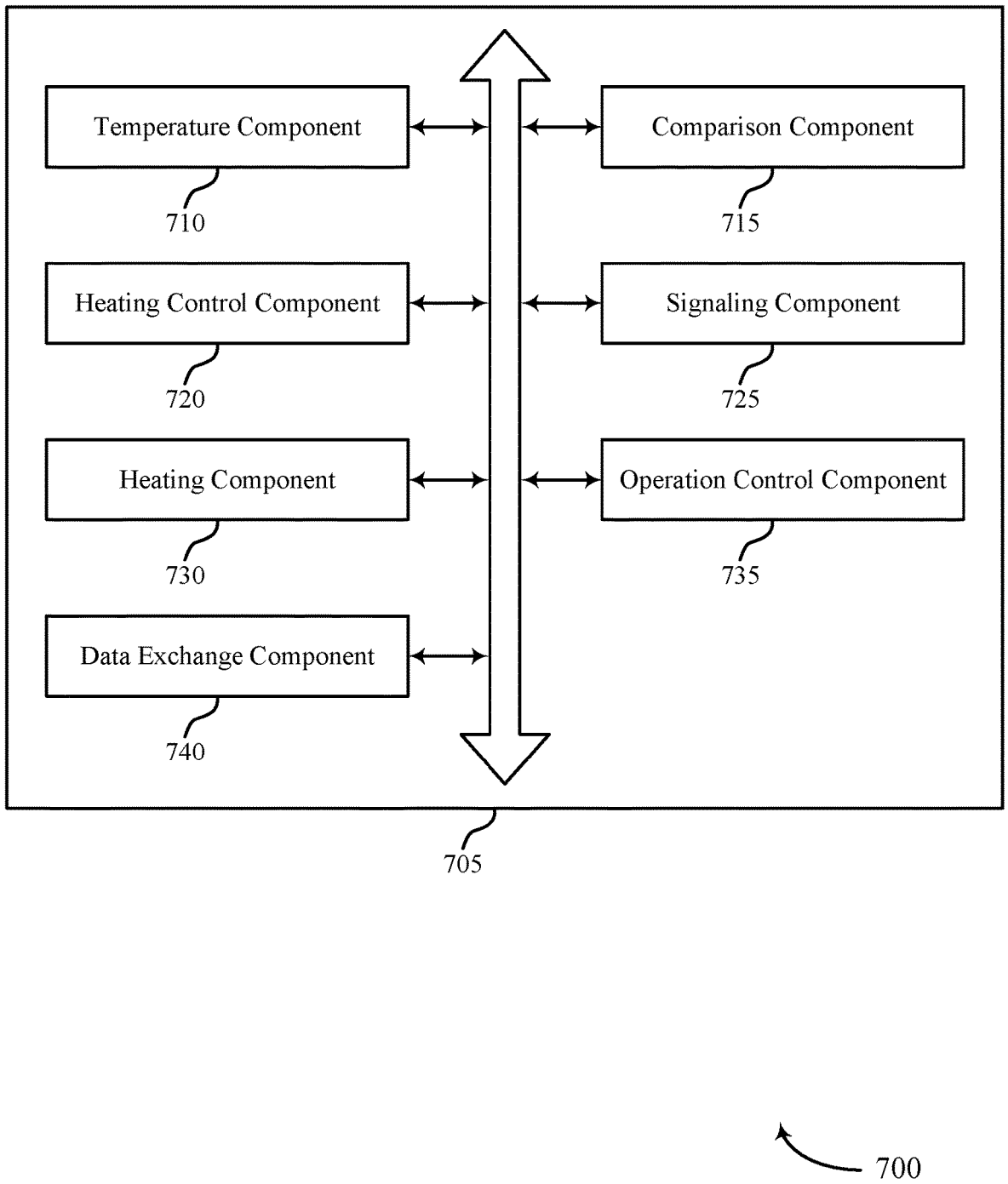
FIG. 7 shows a block diagram of a device that supports controlled and mode-dependent heating of a memory device, in accordance with aspects disclosed herein.

FIG. 7 shows a block diagram 700 of a device 705 that supports controlled and mode-dependent heating of a memory device, in accordance with aspects disclosed herein. In accordance with various examples of the described techniques, the device 705 may be an example of aspects of a system 100, an external memory controller 105, an external memory controller 105, a memory device 110 or a device memory controller 155 as described with reference to FIGS. 1 through 6. The device 705 may include a temperature component 710, a comparison component 715, a heating control component 720, a signaling component 725, a heating component 730, an operation control component 735, and a data exchange component 740. Each of these modules may communicate, directly or indirectly, with one another (e.g., via one or more buses).

The temperature component 710 may determine a temperature of a memory device. In some examples, the temperature component 710 may determine, after activating circuitry configured to heat the memory device, a second temperature of the memory device. In some examples, the temperature component 710 may determine, after deactivating the circuitry configured to heat the memory device, a third temperature of the memory device.

The comparison component 715 may compare a temperature of the memory device to a threshold. In some examples, the comparison component 715 may determine that a second temperature of the memory device satisfies a second threshold. In some cases, the second threshold is higher than the threshold. In some examples, the comparison component 715 may compare a third temperature of the memory device to a third threshold that is higher than the threshold and lower than the second threshold.

In some examples, the comparison component 715 may compare a temperature of the memory device to a third threshold, and operating the memory device in a first mode may be based on the comparison to the third threshold. In some examples, the comparison component 715 may determine, after activating circuitry configured to heat the memory device, that a temperature of the memory device satisfies a threshold, and operating the memory device in a second mode may be based on the determination that the temperature of the memory device satisfies the threshold. In some examples, the comparison component 715 may compare a temperature of the memory device to a second threshold that is less than the threshold, and activating the circuitry configured to heat the memory device may be based on the comparison to the second threshold. In some examples, the comparison component 715 may determine that a temperature of the memory device satisfies a fourth threshold.

The heating control component 720 may activate circuitry or other components configured to heat the memory device based on a comparison of a temperature to a threshold. In some examples, the heating control component 720 may activate circuitry or other components configured to heat the memory device based on receiving signaling associated with a second mode. In some examples, the heating control component 720 may deactivate the circuitry or other components configured to heat the memory device based on a determination that a second temperature satisfies a second threshold. In some examples, the heating control component 720 may activate the circuitry or other components configured to heat the memory device based at least in part comparing a third temperature to a third threshold. In some examples, the heating control component 720 may deactivate the circuitry or other components configured to heat the memory device based on a determination that the temperature of the memory device satisfies a fourth threshold.

The signaling component 725 may receive (e.g., from a host device) signaling associated with a second mode of the memory device. In some cases, the signaling associated with the second mode includes an indication to switch to the second mode. In some cases, the signaling associated with the second mode includes a command to access the memory device. In some examples, the signaling component 725 may transmit (e.g., to a host device) an indication that the memory device is operating in a second mode. In some cases, the indication that the memory device is operating in the second mode includes an indication that the memory device is available for read operations, write operations, or a combination thereof.

In some examples, the signaling component 725 may transmit (e.g., to a host device, based on the comparison of the temperature to the threshold) an indication that access operations for the memory device are restricted. In some examples, the signaling component 725 may indicate that at least one of read operations or write operations are disabled for the memory device. In some examples, the signaling component 725 may initialize the memory device, and transmitting an indication that access operations for the memory device are restricted may be based on the initializing. In some examples, the signaling component 725 may determine a power source of the memory device, and operating the memory device in the first mode may be based on the power source of the memory device. In some examples, the signaling component 725 may receive (e.g., from a host device) an indication to switch to the first mode.

The heating component 730 may couple a voltage source with one or more resistive components in the memory device that are configured to heat the memory device, and activating the circuitry or other components configured to heat the memory device may be based on the coupling. In some examples, the heating component 730 may apply a signal to one or more driver components of the memory device, and activating the circuitry or other components configured to heat the memory device may be based on the applying.

The operation control component 735 may operate a memory device in a first mode of the memory device. In some examples, the operation control component 735 may refresh a memory cell of the memory device based on operating the memory device in the first mode. In some examples, operating the memory device in the first mode is associated with a first power consumption.

In some examples, the operation control component 735 may operate the memory device in the second mode based on activating circuitry or other components configured to heat the memory device. In some examples, the operation control component 735 may access a memory cell of the memory device based on operating the memory device in the second mode. In some examples, operating the memory device in the second mode is associated with a second power consumption that is greater than the first power consumption.

In some examples, the operation control component 735 may switch from operating the memory device in the second mode to operating the memory device in the first mode based on an indication to switch to the first mode. In some examples, the operation control component 735 may determine an elapsed time since an access operation, and switch from operating the memory device in the second mode to operating the memory device in the first mode based on the elapsed time.

The data exchange component 740 may exchange information with a host device. In some examples, accessing a memory device may be based on information exchanged with a host device.

Figure 8:
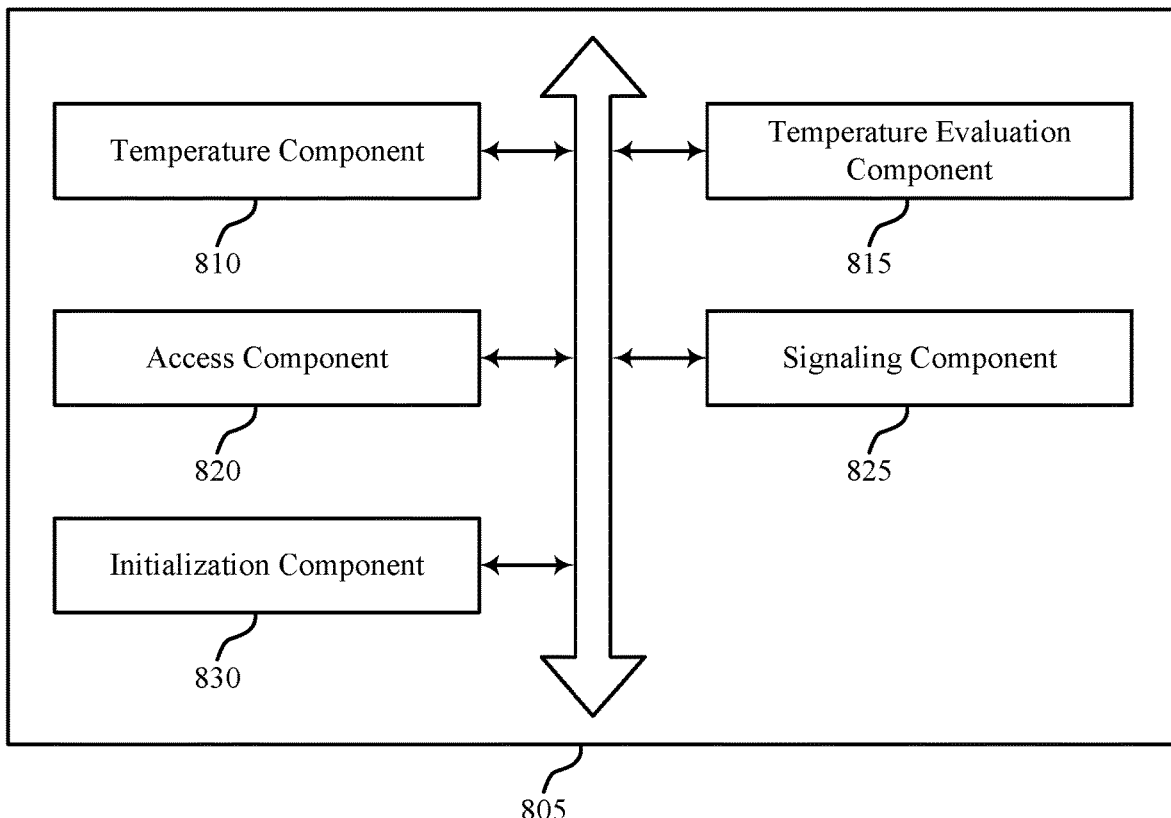
FIG. 8 shows a block diagram of a device that supports controlled and mode-dependent heating of a memory device, in accordance with aspects disclosed herein.

FIG. 8 shows a block diagram 800 of a device 805 that supports controlled and mode-dependent heating of a memory device, in accordance with aspects disclosed herein. In accordance with various examples of the described techniques, the device 805 may be an example of aspects of a system 100, an external memory controller 105, or an external memory controller 105 described with reference to FIGS. 1 through 6. The device 805 may include a temperature component 810, a temperature evaluation component 815, an access component 820, a signaling component 825, and an initialization component 830. Each of these modules may communicate, directly or indirectly, with one another (e.g., via one or more buses).

The temperature component 810 may receive (e.g., at a host device) an indication of a temperature of a memory device that is coupled with a host device. In some examples, the temperature component 810 may receive (e.g., at a host device) an indication of a temperature of a memory device, and the temperature may be associated with a first mode of the memory device. In some cases, the first mode includes a refresh mode. In some examples, the temperature component 810 may receive (e.g., at a host device, after suppressing a command to access the memory device) an indication of a second temperature of the memory device.

The temperature evaluation component 815 may evaluate a temperature of the memory device relative to a threshold.

The access component 820 may suppress (e.g., by a host device) a command to access a memory device based on determining a temperature of the memory device relative to a threshold. In some examples, the access component 820 may perform, based on receiving signaling that indicates the memory device is in a second mode, an access operation associated with the memory device being in the second mode.

In some examples, the access component 820 may issue, to the memory device, a command to access the memory device based on an indication of a second temperature of the memory device. In some examples, the access component 820 may issue, to the memory device, a command to access the memory device based on an indication that the memory device is available. In some examples, the access component 820 may issue, to the memory device based on an initializing, a command to provide an indication of a temperature of the memory device.

The signaling component 825 may transmit (e.g., from a host device) signaling associated with a second mode of the memory device. In some cases, signaling associated with the second mode may include an indication to switch to the second mode. In some cases, signaling associated with the second mode may include a command to access the memory device.

In some examples, the signaling component 825 may receive (e.g., at a host device) signaling that indicates the memory device is in a second mode. In some cases, signaling that indicates the memory device is in the second mode may include an indication that the memory device is available for access operations. In some cases, signaling that indicates the memory device is in the second mode may include an indication of a second temperature of the memory device. In some examples, the signaling component 825 may receive (e.g., at the host device, after suppressing the command to access the memory device) an indication that the memory device is available.

The initialization component 830 may initialize a memory device (e.g., by a host device). In some examples, suppressing a command to access the memory device (e.g., by a host device) may be based on the initializing.

Figure 9:
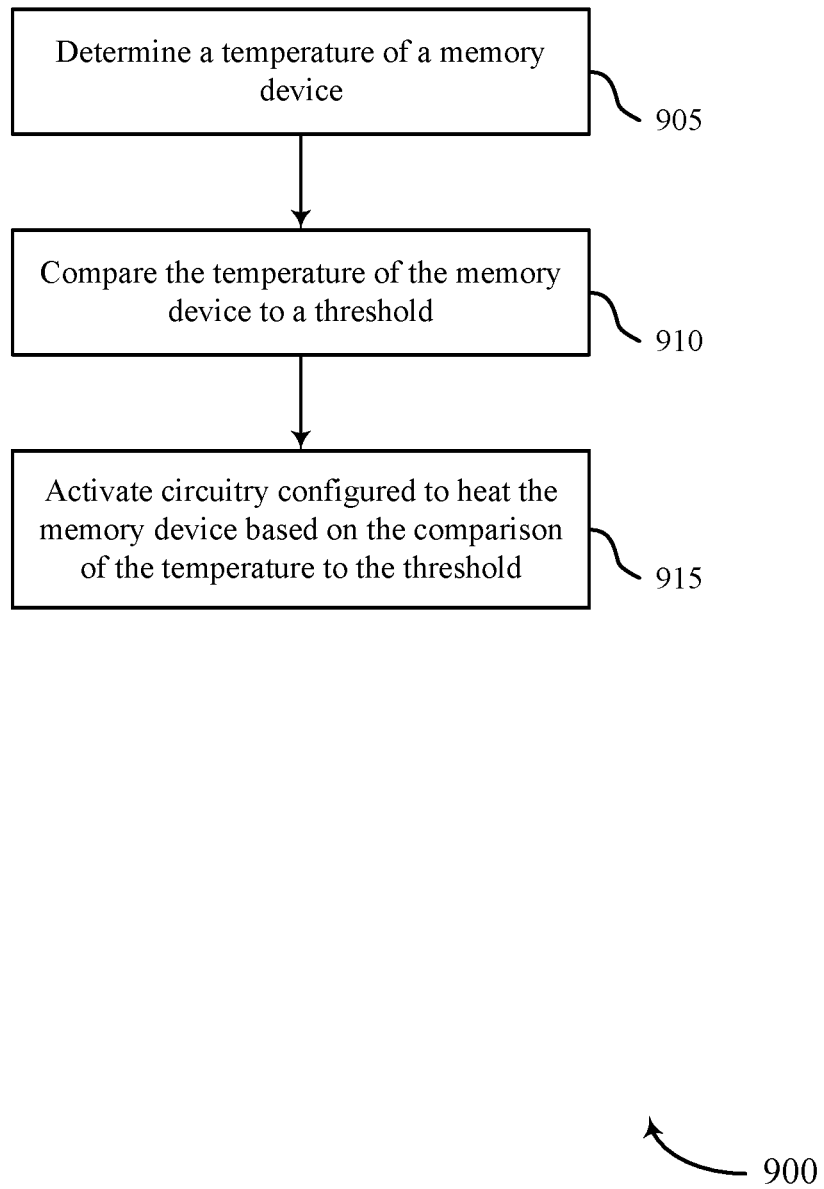
FIGS. 9 through 12 show flowcharts illustrating a method or methods that support controlled and mode-dependent heating of a memory device, in accordance with aspects disclosed herein.

FIG. 9 shows a flowchart illustrating a method 900 that supports controlled and mode-dependent heating of a memory device, in accordance with aspects disclosed herein. The operations of method 900 may be implemented by a memory device 110, an external memory controller 105, a system 100, or various components of a memory device 110, an external memory controller 105, or a system 100, as described with reference to FIGS. 1 through 8. For example, the operations of method 900 may be performed by a device 705, as described with reference to FIG. 7. In some examples, a memory device 110, an external memory controller 105, or a system 100 may execute a set of instructions to control the functional elements of the memory device 110, the external memory controller 105, or the system 100 to perform the described functions. Additionally or alternatively, a memory device 110, an external memory controller 105, or a system 100 may perform aspects of the described functions using special-purpose hardware or circuitry.

At 905, the method 900 may include determining a temperature of a memory device. The operations of 905 may be performed according to the techniques described herein. In some examples, aspects of the operations of 905 may be performed by a temperature component 710 as described with reference to FIG. 7.

At 910, the method 900 may include comparing the temperature of the memory device to a threshold. The operations of 910 may be performed according to the techniques described herein. In some examples, aspects of the operations of 910 may be performed by a comparison component 715 as described with reference to FIG. 7.

At 915, the method 900 may include activating circuitry configured to heat the memory device based on the comparison of the temperature to the threshold. The operations of 915 may be performed according to the techniques described herein. In some examples, aspects of the operations of 915 may be performed by a heating control component 720 as described with reference to FIG. 7.

An apparatus for performing controlled and mode-dependent heating of a memory device is described. The apparatus may include means for determining a temperature of a memory device, means for comparing the temperature of the memory device to a threshold, and means for activating circuitry configured to heat the memory device based on the comparison of the temperature to the threshold.

Another apparatus for performing controlled and mode-dependent heating of a memory device is described. The apparatus may include a controller or circuitry configured to determine a temperature of a memory device, compare the temperature of the memory device to a threshold, and activate circuitry configured to heat the memory device based on the comparison of the temperature to the threshold.

In some examples of the method or apparatuses, the memory device may include cells having capacitive or ferroelectric storage elements.

Some examples of the method or apparatuses may further include operations, features, means, or instructions for determining, after activating the circuitry configured to heat the memory device, a second temperature of the memory device, determining that the second temperature of the memory device satisfies a second threshold, and deactivating the circuitry configured to heat the memory device based on the determination that the second temperature satisfies the second threshold. In some examples of the method or apparatuses, the second threshold is higher than the threshold.

Some examples of the method or apparatuses may further include operations, features, means, or instructions for determining, after deactivating the circuitry configured to heat the memory device, a third temperature of the memory device, comparing the third temperature of the memory device to a third threshold that is higher than the threshold and lower than the second threshold, and activating the circuitry configured to heat the memory device based at least in part comparing the third temperature to the third threshold.

Some examples of the method or apparatuses may further include operations, features, means, or instructions for transmitting, to a host device based on the comparison of the temperature to the threshold, an indication that access operations for the memory device are restricted. In some examples of the method or apparatuses, transmitting the indication that access operations for the memory device are restricted may include operations, features, means, or instructions for indicating that at least one of read operations or write operations are disabled for the memory device.

Some examples of the method or apparatuses may further include operations, features, means, or instructions for initializing the memory device, and transmitting an indication that access operations for the memory device are restricted may be based on the initializing.

Some examples of the method or apparatuses may further include operations, features, means, or instructions for coupling a voltage source with one or more resistive components in the memory device that are configured to heat the memory device, and activating the circuitry configured to heat the memory device may be based on the coupling.

Some examples of the method or apparatuses may further include operations, features, means, or instructions for applying a signal to one or more driver components of the memory device, and activating the circuitry configured to heat the memory device may be based on the applying.

Figure 10:
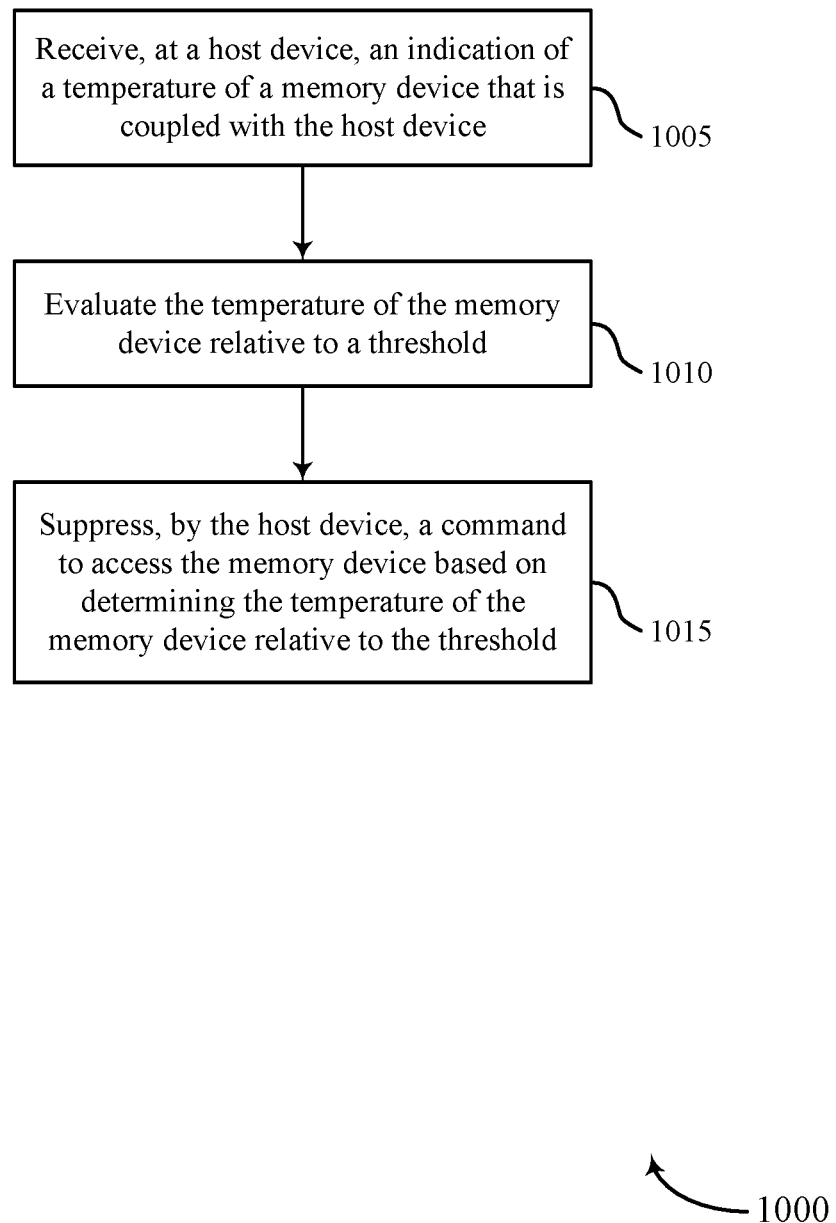

FIG. 10 shows a flowchart illustrating a method 1000 that supports controlled and mode-dependent heating of a memory device, in accordance with aspects disclosed herein. The operations of method 1000 may be implemented by a system 100 or an external memory controller 105, or various components of a system 100 or an external memory controller 105, as described with reference to FIGS. 1 through 8. For example, the operations of method 1000 may be performed by a device 805, as described with reference to FIG. 8. In some examples, a system 100 or an external memory controller 105 may execute a set of instructions to control the functional elements of the host device to perform the described functions. Additionally or alternatively, a system 100 or an external memory controller 105 may perform aspects of the described functions using special-purpose hardware or circuitry.

At 1005, the method 1000 may include receiving (e.g., at a host device) an indication of a temperature of a memory device that is coupled with the host device. The operations of 1005 may be performed according to the techniques described herein. In some examples, aspects of the operations of 1005 may be performed by a temperature component 810 as described with reference to FIG. 8.

At 1010, method 1000 may include evaluating the temperature of the memory device relative to a threshold. The operations of 1010 may be performed according to the techniques described herein. In some examples, aspects of the operations of 1010 may be performed by a temperature evaluation component 815 as described with reference to FIG. 8.

At 1015, the method 1000 may include suppressing (e.g., by a host device) a command to access the memory device based on determining the temperature of the memory device relative to the threshold. The operations of 1015 may be performed according to the techniques described herein. In some examples, aspects of the operations of 1015 may be performed by an access component 820 as described with reference to FIG. 8.

An apparatus for performing the method is described. The apparatus may include means for receiving, at a host device, an indication of a temperature of a memory device that is coupled with the host device, means for evaluating the temperature of the memory device relative to a threshold, and means for suppressing, by the host device, a command to access the memory device based on determining the temperature of the memory device relative to the threshold.

Another apparatus for performing controlled and mode-dependent heating of a memory device is described. The apparatus may include a controller or circuitry configured to receive, at a host device, an indication of a temperature of a memory device that is coupled with the host device, evaluate the temperature of the memory device relative to a threshold, and suppress, by the host device, a command to access the memory device based on determining the temperature of the memory device relative to the threshold.

In some examples of the method or apparatuses, the memory device may include cells having capacitive or ferroelectric storage elements.

Some examples of the method or apparatuses may further include operations, features, means, or instructions for receiving, at the host device after suppressing the command to access the memory device, an indication of a second temperature of the memory device and issuing, to the memory device, the command to access the memory device based on the indication of the second temperature of the memory device.

Some examples of the method or apparatuses may further include operations, features, means, or instructions for receiving (e.g., at the host device, after suppressing the command to access the memory device) an indication that the memory device is available and issuing, to the memory device, the command to access the memory device based on the indication that the memory device may be available.

Some examples of the method or apparatuses may further include operations, features, means, or instructions for initializing the memory device, and suppressing a command to access the memory device may be based on the initializing. Some examples of the method or apparatuses may further include operations, features, means, or instructions for issuing, to the memory device based on the initializing, a command to provide an indication of the temperature of the memory device.

Figure 11:
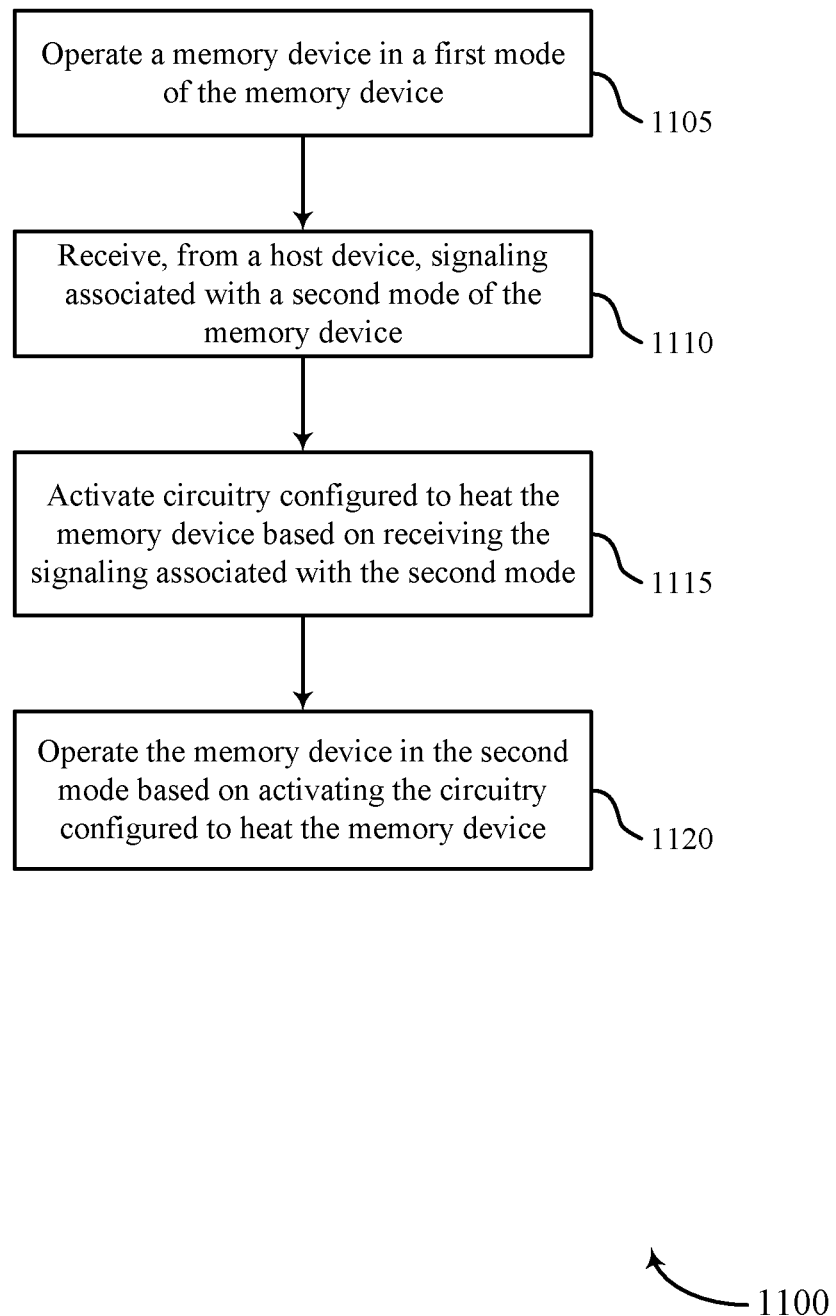

FIG. 11 shows a flowchart illustrating a method 1100 that supports controlled and mode-dependent heating of a memory device, in accordance with aspects disclosed herein.

The operations of method 1100 may be implemented by a memory device 110, or various components of a memory device 110, as described with reference to FIGS. 1 through 8. For example, the operations of method 1100 may be performed by a device 705, as described with reference to FIG. 7. In some examples, a memory device 110 may execute a set of instructions to control the functional elements of the memory device 110 to perform the described functions. Additionally or alternatively, a memory device 110 may perform aspects of the described functions using special-purpose hardware or circuitry.

At 1105, the method 1100 may include operating a memory device in a first mode of the memory device. The operations of 1105 may be performed according to the techniques described herein. In some examples, aspects of the operations of 1105 may be performed by an operation control component 735 as described with reference to FIG. 7.

At 1110, the method 1100 may include receiving, from a host device, signaling associated with a second mode of the memory device. The operations of 1110 may be performed according to the techniques described herein. In some examples, aspects of the operations of 1110 may be performed by a signaling component 725 as described with reference to FIG. 7.

At 1115, the method 1100 may include activating circuitry configured to heat the memory device based on receiving the signaling associated with the second mode. The operations of 1115 may be performed according to the techniques described herein. In some examples, aspects of the operations of 1115 may be performed by a heating control component 720 as described with reference to FIG. 7.

At 1120, the method 1100 may include operating the memory device in the second mode based on activating the circuitry configured to heat the memory device. The operations of 1120 may be performed according to the techniques described herein. In some examples, aspects of the operations of 1120 may be performed by an operation control component 735 as described with reference to FIG. 7.

An apparatus for performing controlled and mode-dependent heating of a memory device is described. The apparatus may include means for operating a memory device in a first mode of the memory device, means for receiving, from a host device, signaling associated with a second mode of the memory device, means for activating circuitry configured to heat the memory device based on receiving the signaling associated with the second mode, and means for operating the memory device in the second mode based on activating the circuitry configured to heat the memory device.

Another apparatus for performing controlled and mode-dependent heating of a memory device is described. The apparatus may include a controller or circuitry configured to operate a memory device in a first mode of the memory device, receive, from a host device, signaling associated with a second mode of the memory device, activate circuitry configured to heat the memory device based on receiving the signaling associated with the second mode, and operate the memory device in the second mode based on activating the circuitry configured to heat the memory device.

In some examples of the method or apparatuses, the memory device may include cells having capacitive or ferroelectric storage elements.

Some examples of the method or apparatuses may further include operations, features, means, or instructions for determining, after activating the circuitry, that a temperature of the memory device satisfies a threshold, and operating the memory device in the second mode may be based on the determination that the temperature of the memory device satisfies the threshold. Some examples of the method or apparatuses may further include operations, features, means, or instructions for comparing the temperature of the memory device to a second threshold that is less than the threshold, and activating the circuitry configured to heat the memory device may be based on the comparison to the second threshold.

Some examples of the method or apparatuses may further include operations, features, means, or instructions for refreshing a memory cell of the memory device based on operating the memory device in the first mode.

Some examples of the method or apparatuses may further include operations, features, means, or instructions for accessing a memory cell of the memory device based on operating the memory device in the second mode. Some examples of the method or apparatuses may further include operations, features, means, or instructions for exchanging information with the host device, and accessing the memory cell of the memory device may be based on information exchanged with the host device.

In some examples of the method or apparatuses, operating the memory device in the first mode may be associated with a first power consumption and operating the memory device in the second mode may be associated with a second power consumption that is greater than the first power consumption.

In some examples of the method or apparatuses, the signaling associated with the second mode may include an indication to switch to the second mode. In some examples of the method or apparatuses, the signaling associated with the second mode may include a command to access the memory device.

Some examples of the method or apparatuses may further include operations, features, means, or instructions for transmitting, to the host device, an indication that the memory device is operating in the second mode. In some examples of the method or apparatuses, the indication that the memory device is operating in the second mode may include an indication that the memory device is available for read operations, write operations, or a combination thereof.

Some examples of the method or apparatuses may further include operations, features, means, or instructions for comparing a temperature of the memory device to a third threshold, and operating the memory device in the first mode may be based on the comparison to the third threshold.

Some examples of the method or apparatuses may further include operations, features, means, or instructions for determining that a temperature of the memory device satisfies a fourth threshold and deactivating the circuitry configured to heat the memory device based on the determination that the temperature of the memory device satisfies the fourth threshold.

Some examples of the method or apparatuses may further include operations, features, means, or instructions for determining a power source of the memory device, and operating the memory device in the first mode may be based on the power source of the memory device.

Some examples of the method or apparatuses may further include operations, features, means, or instructions for receiving, from the host device, an indication to switch to the first mode and switching from operating the memory device in the second mode to operating the memory device in the first mode based on the indication to switch to the first mode.

Some examples of the method or apparatuses may further include operations, features, means, or instructions for determining an elapsed time since an access operation and switching from operating the memory device in the second mode to operating the memory device in the first mode based on the elapsed time.

Figure 12:
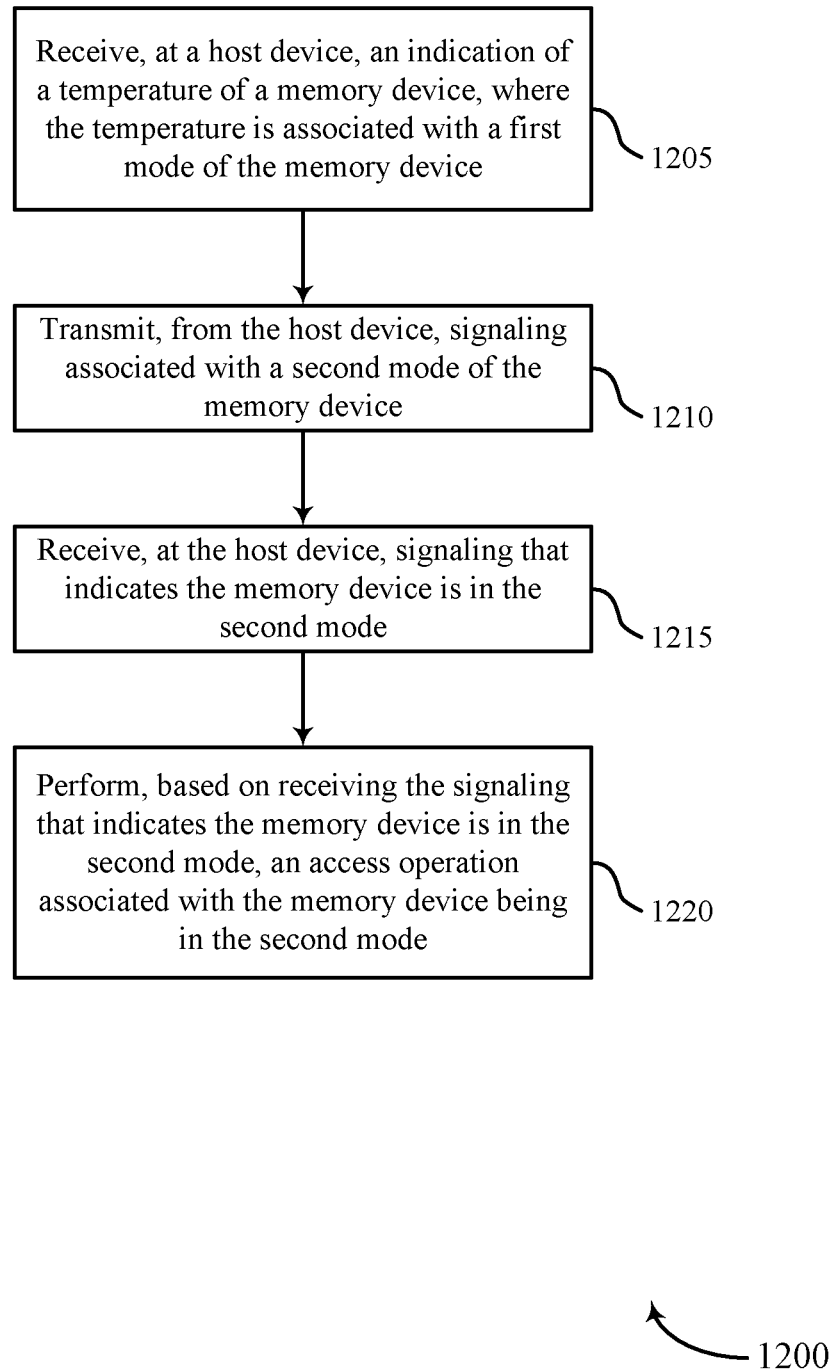

FIG. 12 shows a flowchart illustrating a method 1200 that supports controlled and mode-dependent heating of a memory device, in accordance with aspects disclosed herein. The operations of method 1200 may be implemented by a system 100 or an external memory controller 105, or various components of a system 100 or an external memory controller 105, as described with reference to FIGS. 1 through 8. For example, the operations of method 1200 may be performed by a device 805, as described with reference to FIG. 8. In some examples, a system 100 or an external memory controller 105 may execute a set of instructions to control the functional elements of the host device to perform the described functions. Additionally or alternatively, a system 100 or an external memory controller 105 may perform aspects of the described functions using special-purpose hardware or circuitry.

At 1205, the method 1200 may include receiving (e.g., at a host device) an indication of a temperature of a memory device, where the temperature is associated with a first mode of the memory device. The operations of 1205 may be performed according to the techniques described herein. In some examples, aspects of the operations of 1205 may be performed by a temperature component 810 as described with reference to FIG. 8.

At 1210, the method 1200 may include transmitting (e.g., from the host device) signaling associated with a second mode of the memory device. The operations of 1210 may be performed according to the techniques described herein. In some examples, aspects of the operations of 1210 may be performed by a signaling component 825 as described with reference to FIG. 8.

At 1215, the method 1200 may include receiving (e.g., at the host device) signaling that indicates the memory device is in the second mode. The operations of 1215 may be performed according to the techniques described herein. In some examples, aspects of the operations of 1215 may be performed by a signaling component 825 as described with reference to FIG. 8.

At 1220, the method 1200 may include performing, based on receiving the signaling that indicates the memory device is in the second mode, an access operation associated with the memory device being in the second mode. The operations of 1220 may be performed according to the techniques described herein. In some examples, aspects of the operations of 1220 may be performed by an access component 820 as described with reference to FIG. 8.

An apparatus for performing the method is described. The apparatus may include means for receiving, at a host device, an indication of a temperature of a memory device, where the temperature is associated with a first mode of the memory device, means for transmitting, from the host device, signaling associated with a second mode of the memory device, receiving, at the host device, signaling that indicates the memory device is in the second mode, and performing, based on receiving the signaling that indicates the memory device is in the second mode, an access operation associated with the memory device being in the second mode.

Another apparatus for performing controlled and mode-dependent heating of a memory device is described. The apparatus may include a controller or circuitry configured to receive, at a host device, an indication of a temperature of a memory device, where the temperature is associated with a first mode of the memory device, transmit, from the host device, signaling associated with a second mode of the memory device, receive, at the host device, signaling that indicates the memory device is in the second mode, and perform, based on receiving the signaling that indicates the memory device is in the second mode, an access operation associated with the memory device being in the second mode.

In some examples of the method or apparatuses, the memory device may include cells having capacitive or ferroelectric storage elements.

In some examples of the method or apparatuses, the signaling that indicates the memory device is in the second mode may include an indication that the memory device is available for access operations. In some examples of the method or apparatuses, the signaling that indicates the memory device is in the second mode may include an indication of a second temperature of the memory device.

In some examples of the method or apparatuses, the signaling associated with the second mode may include an indication to switch to the second mode. In some examples of the method or apparatuses, the signaling associated with the second mode may include a command to access the memory device. In some examples of the method or apparatuses, the first mode may include a refresh mode.

It should be noted that the described methods relate to possible implementations, and that the operations and the steps may be rearranged or otherwise modified and that other implementations are possible. Furthermore, aspects from two or more of the methods may be combined.

It should be noted that the methods, systems, and apparatuses described herein describe possible implementations, and that the operations and the steps may be rearranged or otherwise modified and that other implementations are possible. Further, aspects from two or more of the methods or other techniques may be combined.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Although certain features or techniques may be described herein with respect to or in the context of capacitive memory technology (e.g., DRAM technology), such descriptions are for illustrative purposes, and one of ordinary skill in the art will appreciate that the teachings herein may be applied to any type of memory device. For example, the teachings herein may be applied to volatile or non-volatile memory devices such as magnetic hard disks, random access memory (RAM), read-only memory (ROM), dynamic RAM (DRAM), synchronous dynamic RANI (SDRAM), ferroelectric RAM (FeRAM), magnetic RANI (MRAM), resistive RAM (RRAM), flash memory, phase change memory (PCM), and others.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signaling as a single signal. However, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "coupling" may refer to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" may refer to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "electrode" may refer to an electrical conductor, and in some cases, may be employed as an electrical contact to a memory cell or other component of a memory array. An electrode may include a trace, wire, conductive line, conductive layer, or other feature that provides a conductive path between elements or components of memory array.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain, and the unexposed regions may be removed.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
operating a memory device in a first mode of the memory device that comprises cells having capacitive storage elements;
transmitting, to a host device, an indication of a temperature of the memory device based at least in part on operating the memory device in the first mode;
receiving, from the host device, signaling associated with a second mode of the memory device based at least in part on transmitting the indication of the temperature, wherein the signaling associated with the second mode comprises a command for a read operation or a command for a write operation;
activating circuitry configured to heat the memory device based at least in part on receiving the signaling associated with the second mode; and
operating the memory device in the second mode based at least in part on activating the circuitry configured to heat the memory device.

2. The method of claim 1, further comprising:
determining, after activating the circuitry, that the temperature of the memory device satisfies a threshold, wherein operating the memory device in the second mode is based at least in part on the determination that the temperature of the memory device satisfies the threshold.

3. The method of claim 2, further comprising:
comparing the temperature of the memory device to a second threshold that is less than the threshold, wherein activating the circuitry configured to heat the memory device is based at least in part on the comparison to the second threshold.

4. The method of claim 1, further comprising:
refreshing a memory cell of the memory device based at least in part on operating the memory device in the first mode.

5. The method of claim 1, further comprising:
accessing a memory cell of the memory device based at least in part on operating the memory device in the second mode.

6. The method of claim 5, further comprising:
exchanging information with the host device, wherein the accessing is based at least in part on information exchanged with the host device.

7. The method of claim 1, wherein:
operating the memory device in the first mode is associated with a first power consumption; and
operating the memory device in the second mode is associated with a second power consumption that is greater than the first power consumption.

8. The method of claim 1, wherein the signaling associated with the second mode comprises an indication to switch to the second mode.

9. The method of claim 1, further comprising:
transmitting, to the host device, an indication that the memory device is operating in the second mode.

10. The method of claim 9, wherein the indication that the memory device is operating in the second mode comprises an indication that the memory device is available for read operations, write operations, or a combination thereof.

11. The method of claim 1, further comprising:
comparing the temperature of the memory device to a third threshold, wherein operating the memory device in the first mode is based at least in part on the comparison to the third threshold.

12. The method of claim 1, further comprising:
determining that the temperature of the memory device satisfies a fourth threshold; and
deactivating the circuitry configured to heat the memory device based at least in part on the determination that the temperature of the memory device satisfies the fourth threshold.

13. The method of claim 1, further comprising:
determining a power source of the memory device, wherein operating the memory device in the first mode is based at least in part on the power source of the memory device.

14. The method of claim 1, further comprising:
receiving, from the host device, an indication to switch to the first mode; and
switching from operating the memory device in the second mode to operating the memory device in the first mode based at least in part on the indication to switch to the first mode.

15. The method of claim 1, further comprising:
determining an elapsed time since an access operation; and
switching from operating the memory device in the second mode to operating the memory device in the first mode based at least in part on the elapsed time.

16. The method of claim 1, wherein the first mode comprises a standby mode, an idle mode, a powered-down mode, or a combination thereof, and wherein the second mode is associated with one or more access operations at the memory device.

17. An apparatus, comprising:
a memory device that comprises cells having capacitive storage elements;
a temperature sensor configured to indicate a temperature of the memory device; and
a controller of the memory device configured to cause the apparatus to:
transmit, to a host device, an indication of the temperature of the memory device based at least in part on operating the memory device in a first mode;
receive, from the host device while the memory device is in the first mode, signaling associated with a second mode of the memory device based at least in part on transmitting the indication of the temperature, wherein the signaling associated with the second mode comprises a command for a read operation or a command for a write operation;
activate circuitry configured to heat the memory device based at least in part on receiving signaling associated with the second mode;
compare an indication of the temperature of the memory device generated by the temperature sensor with a threshold; and
operate the memory device in the second mode based at least in part on the comparison of the indication with the threshold.

18. The apparatus of claim 17, wherein the controller is further configured to cause the apparatus to:
compare a second indication of the temperature of the memory device generated by the temperature sensor with a second threshold, wherein activating the circuitry configured to heat the memory device is based at least in part on the comparison of the second indication with the second threshold.

19. The apparatus of claim 17, wherein the controller is further configured to cause the apparatus to:
perform a refresh operation of the memory device while operating the memory device in the first mode.

20. The apparatus of claim 17, wherein the controller is further configured to cause the apparatus to:
perform the read operation or the write operation while operating the memory device in the second mode.

21. The apparatus of claim 17, wherein the controller is further configured to cause the apparatus to:
transmit, to the host device, an indication that the memory device is operating in the second mode based at least in part on the comparison of the indication with the threshold.

22. The apparatus of claim 17, wherein the controller is further configured to cause the apparatus to:
compare a third indication of the temperature of the memory device generated by the temperature sensor with a third threshold, wherein operating the memory device in the first mode is based at least in part on the comparison of the third indication with the third threshold.

23. The apparatus of claim 17, wherein the controller is further configured to:
compare a fourth indication of the temperature of the memory device generated by the temperature sensor with a fourth threshold; and
adjust the circuitry configured to heat the memory device based at least in part on the comparison of the fourth indication with the fourth threshold.

24. A method, comprising:
receiving, at a host device, an indication of a temperature of a memory device that comprises cells having capacitive storage elements, wherein the temperature is associated with a first mode of the memory device;
determining, at the host device, to operate the memory device in a second mode based at least in part on receiving the indication of the temperature, wherein determining to operate the memory device in the second mode comprises comparing the temperature of the memory device to a threshold temperature;
transmitting, from the host device, signaling associated with the second mode of the memory device, wherein the signaling associated with the second mode comprises a command for a read operation or a command for a write operation;
receiving, at the host device, signaling that indicates the memory device is in the second mode; and
performing, based at least in part on receiving the signaling that indicates the memory device is in the second mode, an access operation associated with the memory device being in the second mode.

25. The method of claim 24, wherein the signaling that indicates the memory device is in the second mode comprises an indication of a second temperature of the memory device.

* * * * *